US010229948B2

(12) United States Patent
Shimotsusa

(10) Patent No.: US 10,229,948 B2
(45) Date of Patent: *Mar. 12, 2019

(54) SEMICONDUCTOR APPARATUS

(71) Applicant: CANON KABUSHIKI KAISHA, Tokyo (JP)

(72) Inventor: Mineo Shimotsusa, Machida (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/175,560

(22) Filed: Jun. 7, 2016

(65) Prior Publication Data

US 2016/0284755 A1 Sep. 29, 2016

Related U.S. Application Data

(63) Continuation of application No. 14/038,516, filed on Sep. 26, 2013, now Pat. No. 9,391,112.

(30) Foreign Application Priority Data

Sep. 28, 2012 (JP) .................................. 2012-215970

(51) Int. Cl.
*H01L 27/146* (2006.01)
*H01L 23/00* (2006.01)
(Continued)

(52) U.S. Cl.
CPC .. *H01L 27/14636* (2013.01); *H01L 21/76898* (2013.01); *H01L 23/481* (2013.01);
(Continued)

(58) Field of Classification Search
CPC .......... H01L 27/14636; H01L 27/1464; H01L 27/14634; H01L 27/1469
See application file for complete search history.

(56) References Cited

U.S. PATENT DOCUMENTS 6,204,204 B1 * 3/2001 Paranjpe ................. C23C 16/34
257/E21.17
8,563,403 B1 10/2013 Farooq et al.
(Continued)

FOREIGN PATENT DOCUMENTS

JP 2001326326 A 11/2001
JP 2001339057 A 12/2001
(Continued)

*Primary Examiner* — Bitew A Dinke
(74) *Attorney, Agent, or Firm* — Canon U.S.A., Inc. IP Division

(57) ABSTRACT

A semiconductor apparatus includes a conductive member penetrating through a first semiconductor layer, a first insulator layer, and a third insulator layer, and connecting a first conductor layer with a second conductor layer. The conductive member has a first region containing copper, and a second region containing a material different from the copper is located at least between a first region and the first semiconductor layer, between the first region and the first insulator layer, and between the first region and the third insulator layer. A diffusion coefficient of the copper to a material is lower than a diffusion coefficient of the copper to the first semiconductor layer and a diffusion coefficient of the copper to the first insulator layer.

42 Claims, 12 Drawing Sheets

(51) Int. Cl.
  *H01L 23/48* (2006.01)
  *H01L 25/065* (2006.01)
  *H01L 21/768* (2006.01)

(52) U.S. Cl.
  CPC .......... *H01L 24/05* (2013.01); *H01L 25/0657* (2013.01); *H01L 27/1464* (2013.01); *H01L 27/1469* (2013.01); *H01L 27/14634* (2013.01); *H01L 27/14618* (2013.01); *H01L 27/14632* (2013.01); *H01L 2224/02166* (2013.01); *H01L 2224/04042* (2013.01); *H01L 2224/48091* (2013.01); *H01L 2224/48463* (2013.01); *H01L 2225/06544* (2013.01); *H01L 2225/06565* (2013.01); *H01L 2924/12043* (2013.01); *H01L 2924/13091* (2013.01)

(56) References Cited

U.S. PATENT DOCUMENTS

| | | | |
|---|---|---|---|
| 9,391,112 B2 * | 7/2016 | Shimotsusa | H01L 21/76898 |
| 2004/0227242 A1 * | 11/2004 | Noguchi | H01L 21/314 257/751 |
| 2004/0262635 A1 | 12/2004 | Lee | |
| 2005/0101116 A1 | 5/2005 | Tseng | |
| 2007/0037379 A1 | 2/2007 | Enquist et al. | |
| 2007/0052067 A1 | 3/2007 | Umemoto | |
| 2008/0029850 A1 | 2/2008 | Hedler et al. | |
| 2009/0134497 A1 | 5/2009 | Barth | |
| 2009/0224345 A1 | 9/2009 | Lee et al. | |
| 2009/0315184 A1 * | 12/2009 | Tokitoh | H01L 23/522 257/758 |
| 2010/0026865 A1 | 2/2010 | Tivarus et al. | |
| 2010/0155932 A1 | 6/2010 | Gambino | |
| 2010/0176271 A1 | 7/2010 | Rim et al. | |
| 2010/0246152 A1 | 9/2010 | Lin et al. | |
| 2011/0026232 A1 * | 2/2011 | Lin | H01L 21/76898 361/760 |
| 2011/0049336 A1 | 3/2011 | Matsunuma | |
| 2011/0096215 A1 | 4/2011 | Kobayashi | |
| 2011/0102657 A1 * | 5/2011 | Takahashi | H01L 23/481 348/308 |
| 2011/0155893 A1 | 6/2011 | Endo et al. | |
| 2011/0157445 A1 | 6/2011 | Itonaga et al. | |
| 2011/0193169 A1 | 8/2011 | Assefa et al. | |
| 2011/0233702 A1 * | 9/2011 | Takahashi | H01L 21/76898 257/432 |
| 2011/0298097 A1 | 12/2011 | Sueyoshi et al. | |
| 2012/0062777 A1 * | 3/2012 | Kobayashi | H01L 27/14623 348/302 |
| 2012/0098081 A1 | 4/2012 | Horiike et al. | |
| 2012/0105696 A1 | 5/2012 | Maeda | |
| 2012/0126096 A1 | 5/2012 | Sugiura et al. | |
| 2012/0153419 A1 | 6/2012 | Itonaga et al. | |
| 2012/0193744 A1 | 8/2012 | Borthakur et al. | |
| 2012/0193785 A1 | 8/2012 | Lin et al. | |
| 2012/0248580 A1 | 10/2012 | Matsugai | |
| 2012/0256319 A1 * | 10/2012 | Mitsuhashi | H01L 27/14634 257/774 |
| 2012/0267690 A1 | 10/2012 | Endo | |
| 2012/0267740 A1 * | 10/2012 | Okamoto | H01L 21/76898 257/432 |
| 2012/0292746 A1 | 11/2012 | Lee et al. | |
| 2012/0293698 A1 | 11/2012 | Sukegawa et al. | |
| 2013/0020468 A1 * | 1/2013 | Mitsuhashi | H01L 27/14623 250/208.1 |
| 2013/0082260 A1 | 4/2013 | Nakamura | |
| 2013/0082341 A1 * | 4/2013 | Shimizu | H01L 27/14636 257/431 |
| 2013/0087788 A1 | 4/2013 | Nakamura | |
| 2013/0105667 A1 | 5/2013 | Kobayashi | |
| 2013/0105924 A1 | 5/2013 | Kobayashi et al. | |
| 2013/0107075 A1 | 5/2013 | Kobayashi et al. | |
| 2013/0134576 A1 | 5/2013 | Hayashi | |
| 2013/0181317 A1 | 7/2013 | Wakiyama et al. | |
| 2013/0221473 A1 * | 8/2013 | Shimotsusa | H01L 31/024 257/443 |
| 2013/0234341 A1 | 9/2013 | Onai | |
| 2013/0256824 A1 * | 10/2013 | Mizuta | H01L 27/1464 257/459 |
| 2013/0307103 A1 | 11/2013 | Lin et al. | |
| 2014/0061915 A1 | 3/2014 | Collins et al. | |
| 2014/0094030 A1 | 4/2014 | Shimotsusa | |
| 2014/0217486 A1 | 8/2014 | Akiyama | |
| 2015/0021784 A1 | 1/2015 | Lin | |
| 2016/0260763 A1 * | 9/2016 | Shimotsusa | H01L 27/14634 |

FOREIGN PATENT DOCUMENTS

| | | |
|---|---|---|
| JP | 2003203914 A | 7/2003 |
| JP | 2005150717 A | 6/2005 |
| JP | 2006128669 A | 5/2006 |
| JP | 2006339566 A | 12/2006 |
| JP | 2007067216 A | 3/2007 |
| JP | 2007525004 A | 8/2007 |
| JP | 2008258201 A | 10/2008 |
| JP | 2008270354 A | 11/2008 |
| JP | 2009076882 A | 4/2009 |
| JP | 2009541990 A | 11/2009 |
| JP | 2010114350 A | 5/2010 |
| JP | 2010153799 A | 7/2010 |
| JP | 2010530633 A | 9/2010 |
| JP | 2011049445 A | 3/2011 |
| JP | 2011054637 A | 3/2011 |
| JP | 2011091400 A | 5/2011 |
| JP | 2011138841 A | 7/2011 |
| JP | 2011146655 A | 7/2011 |
| JP | 2011-151375 A | 8/2011 |
| JP | 2011159958 A | 8/2011 |
| JP | 2011199314 A | 10/2011 |
| JP | 2011204915 A | 10/2011 |
| JP | 2011530165 A | 12/2011 |
| JP | 2012004383 A | 1/2012 |
| JP | 2012004386 A | 1/2012 |
| JP | 2012015277 A | 1/2012 |
| JP | 2012033878 A | 2/2012 |
| JP | 2012033894 A | 2/2012 |
| JP | 2012064709 A | 3/2012 |
| JP | 2012064950 A | 3/2012 |
| JP | 2012084693 A | 4/2012 |
| JP | 2012089739 A | 5/2012 |
| JP | 2012094720 A | 5/2012 |
| JP | 2012114143 A | 6/2012 |
| JP | 2012142360 A | 7/2012 |
| JP | 2012522398 A | 9/2012 |
| JP | 2012-222183 A | 11/2012 |
| JP | 2013-115289 A | 6/2013 |
| JP | 6128787 B2 | 5/2017 |
| WO | 2011/077580 A1 | 6/2011 |

* cited by examiner

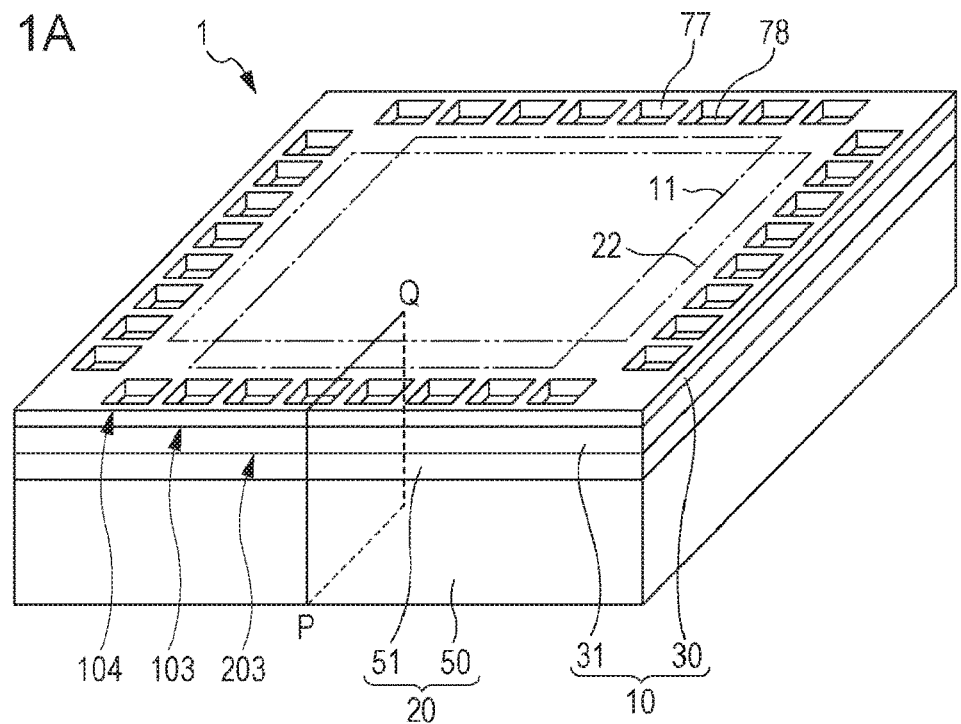
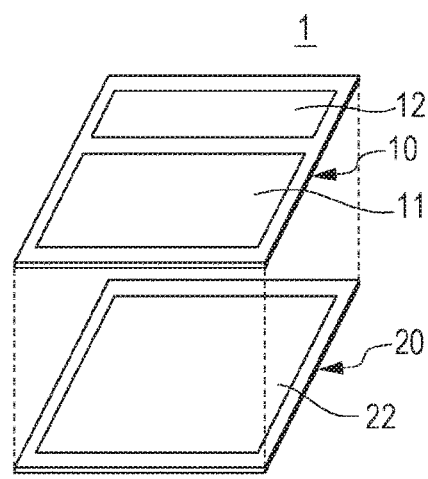
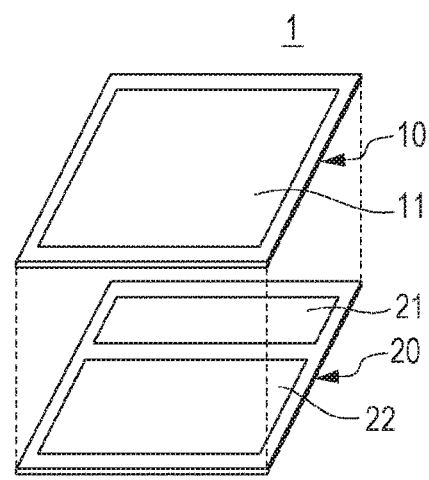
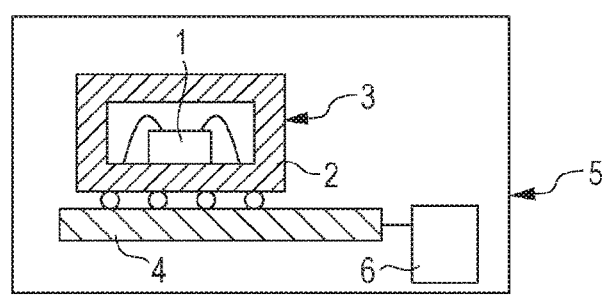

SEMICONDUCTOR APPARATUS

CROSS-REFERENCE TO RELATED APPLICATIONS

This application is a continuation of U.S. patent application Ser. No. 14/038,516 filed Sep. 26, 2013, which claims the benefit of Japanese Patent Application No. 2012-215970 filed Sep. 28, 2012, all of which are hereby incorporated by reference herein in their entirety.

BACKGROUND OF THE INVENTION

Field of the Invention

The present technology relates to a semiconductor apparatus including a plurality of element parts.

Description of the Related Art

In a photoelectric conversion apparatus such as a complementary metal-oxide semiconductor (CMOS) image sensor which is a type of semiconductor apparatus, a photoelectric conversion unit having a plurality of photoelectric conversion elements and a signal processing unit that processes an electric signal from the photoelectric conversion unit are built onto a single semiconductor substrate in a monolithic manner. A structure is being studied in which the photoelectric conversion unit and the signal processing unit are formed on individual parts (chips), the parts are stacked on each other, and the parts are electrically connected with each other through a conductive member. Accordingly, an occupied area (a footprint) of the photoelectric conversion apparatus in electronic equipment on which the photoelectric conversion apparatus is mounted can be efficiently utilized. The conductive member is provided to obtain the electrical connection between the parts. Such a structure may be applied to any of various semiconductor apparatuses that realize so-called system-in packages.

Japanese Patent Laid-Open No. 2011-096851 describes that inter-substrate wiring (68) is provided as the conductive member for obtaining the electrical connection between semiconductor substrates (31, 45) corresponding to the parts.

If the inter-substrate wiring in Japanese Patent Laid-Open No. 2011-096851 is formed of copper, the copper contained in the inter-substrate wiring may be diffused to a semiconductor well region (32) surrounding the inter-substrate wiring or an interlayer insulating film (39). Consequently, the semiconductor apparatus may not be correctly operated, or a desirable performance may not be obtained due to contamination with the copper. Sufficient reliability may not be obtained. This technique provides a semiconductor apparatus having high reliability.

SUMMARY OF THE INVENTION

This disclosure provides a semiconductor apparatus including a first element part including a first semiconductor layer; a first wiring part including a first conductor layer, and a first insulator layer located between the first semiconductor layer and the first conductor layer; a second element part including a second semiconductor layer; a second wiring part including a second conductor layer, and a second insulator layer located between the second semiconductor layer and the second conductor layer, the second wiring part being located between the first element part and the second element part and between the first wiring part and the second element part; a third insulator layer located between the first conductor layer and the second conductor layer; and a conductive member penetrating through the first semiconductor layer, the first insulator layer, and the third insulator layer, and connecting the first conductor layer with the second conductor layer. The conductive member has a first region containing copper, and a second region containing a material different from the copper is located at least between the first region and the first semiconductor layer, between the first region and the first insulator layer, and between the first region and the third insulator layer. A diffusion coefficient of the copper to the material is lower than a diffusion coefficient of the copper to the first semiconductor layer and a diffusion coefficient of the copper to the first insulator layer.

Further features of the present technology will become apparent from the following description of exemplary embodiments with reference to the attached drawings.

BRIEF DESCRIPTION OF THE DRAWINGS

FIGS. 1A to 1D are schematic illustrations showing an example of a semiconductor apparatus.

FIGS. 3A-1, 3A-2, and 3B are schematic illustrations showing an example of a manufacturing method of the semiconductor apparatus.

DESCRIPTION OF THE EMBODIMENTS

Figure 2:
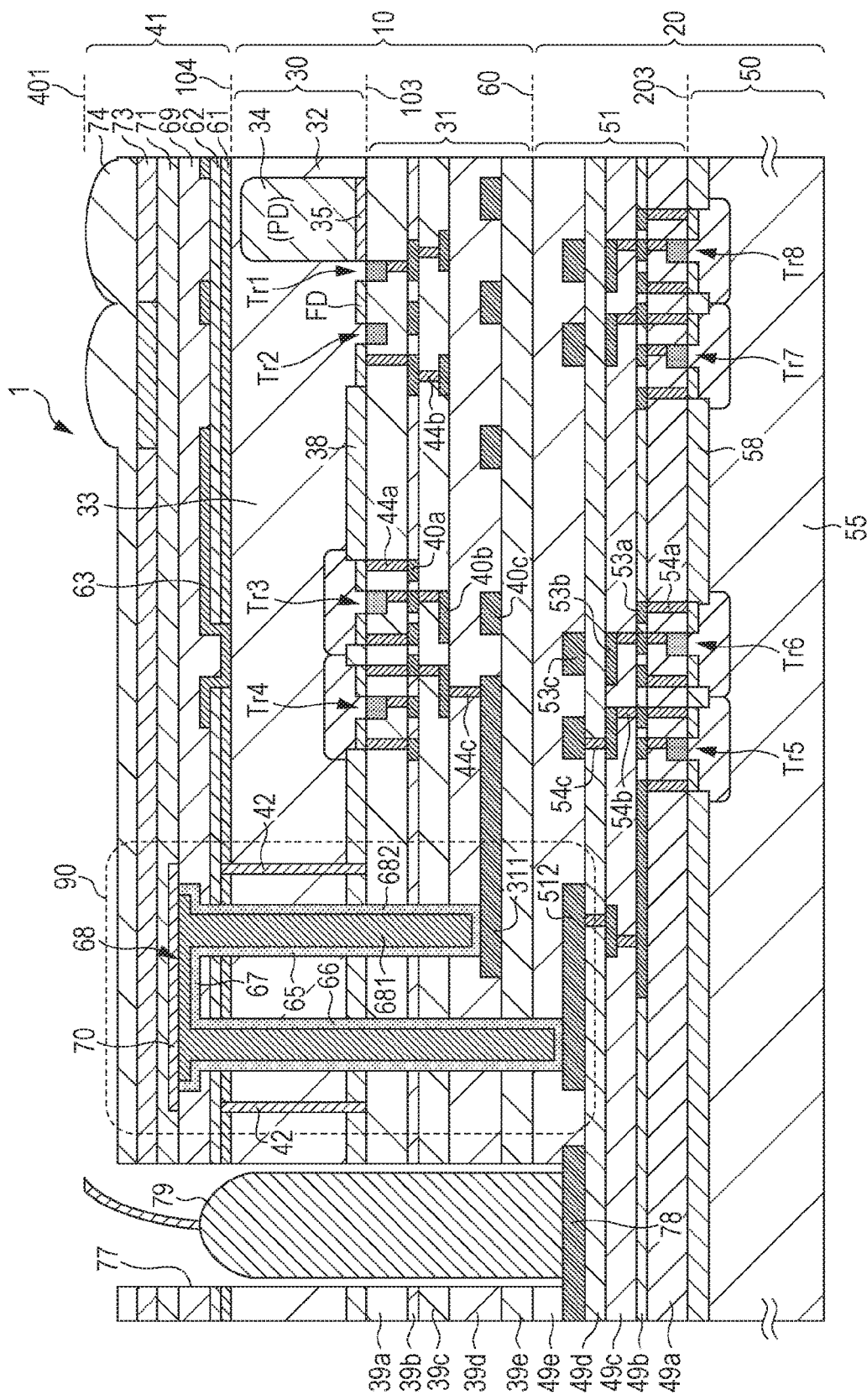
FIG. 2 is a schematic illustration showing the example of the semiconductor apparatus.

Embodiments for implementing the present technology are described with reference to the drawings. In the following description, a plurality of mutually related drawings may be referenced. Also, common reference signs are applied to equivalent or similar configurations. Redundant description for the configuration applied with the common reference sign is occasionally omitted.

First Embodiment

A photoelectric conversion apparatus serving as an example of a semiconductor apparatus according to this embodiment is described with reference to FIGS. 1A to 1D. FIG. 1A is a perspective view of a semiconductor device 1 which is a primary portion of the semiconductor apparatus. FIGS. 1B and 1C are exploded perspective views of an example of the semiconductor device 1. FIG. 1D is a schematic illustration of electronic equipment 5 including a semiconductor apparatus 3 including the semiconductor device 1.

In the semiconductor device 1 shown in FIG. 1A, a first section 10 is stacked on a second section 20 as shown in FIG. 1B or 1C. This embodiment mainly relates to a conductive member for obtaining electrical connection between the first section 10 and the second section 20. As shown in FIG. 1A, the first section 10 includes a first element part 30 and a first wiring part 31. The second section 20 includes a second element part 50 and a second wiring part 51. The second wiring part 51 is located between the first section 10 and the second element part 50. That is, the second wiring part 51 is located between the first element part 30 and the second element part 50, and the second wiring part 51 is located between the first wiring part 31 and the second element part 50. In this embodiment, the first wiring part 31 is located between the first element part 30 and the second section 20; however, the first element part 30 may be located between the first wiring part 31 and the second section 20.

In this embodiment, the first section 10 includes a photoelectric conversion unit 11. The photoelectric conversion unit 11 includes a photoelectric conversion element that generates a signal carrier in accordance with incident light. The photoelectric conversion unit 11 may include a signal generation circuit that generates an electric signal based on the signal carrier generated by the photoelectric conversion element. The signal generation circuit includes, for example, an amplification transistor, a transfer transistor, a reset transistor, and a selection transistor. A photoelectric conversion unit 11 of another example may include a photoelectric conversion element and a charge coupled device (CCD) that transfers a signal carrier.

In this embodiment, the second section 20 includes a signal processing unit 22. The signal processing unit 22 processes the electric signal based on the signal carrier generated by the photoelectric conversion unit 11. The signal processing unit 22 may include a noise reduction circuit, an amplification circuit, a conversion circuit, and an image processing circuit. The noise reduction circuit is, for example, a correlated double sampling (CDS) circuit. The amplification circuit is, for example, a column amplification circuit. The conversion circuit is, for example, an analog digital converter (ADC) circuit including a comparator and a counter. The image processing circuit includes, for example, a memory and a processor. The image processing circuit generates image data from a digital signal after analog-digital conversion, and performs image processing on image data.

FIG. 1A illustrates the position of the photoelectric conversion unit 11 by surrounding it with a single-dot chain line, and the position of the signal processing unit 22 by surrounding it with a two-dot chain line. The signal processing unit 22 is located in an orthogonal projection region of the photoelectric conversion unit 11 to the second section 20. The signal processing unit 22 may be arranged inside and outside the orthogonal projection region of the photoelectric conversion unit 11. A portion of the signal processing unit 22 may be provided at the first section 10. For example, a signal processing unit for analog signals, such as the noise reduction circuit, and the amplification circuit, may be provided at the first section 10 and a signal processing unit for digital signals, such as the conversion circuit and the image processing circuit, may be provided at the second section 20.

As shown in FIGS. 1B and 1C, the semiconductor device 1 may further include a control unit 12 that controls the photoelectric conversion unit 11, and/or a control unit 21 that controls the signal processing unit 22. The control units may be provided at least one of the first section 10 and the second section 20. In the example shown in FIG. 1B, the control unit 12 is provided at the first section 10. In the example shown in FIG. 1C, the control unit 21 is provided at the second section 20. Alternatively, the control unit for the photoelectric conversion unit 11 may be provided at the first section 10, and the control unit for the signal processing unit 22 may be provided at the second section 20. The control unit 12 may include a vertical driving circuit that supplies a pixel circuit with a driving signal through a vertical scanning line, and may include a power supply circuit. The control unit 21 may include a timing generation circuit that drives the signal processing unit 22, a reference-signal supply circuit that supplies the conversion circuit with a reference signal, and a horizontal scanning circuit that successively reads signals from the amplification circuit or the conversion circuit.

As shown in FIG. 1D, the semiconductor apparatus 3 may include a package 2 as a mounting member for first mounting of the semiconductor device 1. The semiconductor device 1 may be bonded to the package by die bonding, and may be housed in the package. The package 2 may include an external terminal, such as a ping grid array (PGA), a land grind array (LGA), a ball grid array (BGA), or a lead frame. As shown in FIG. 1D, the semiconductor apparatus 3 may include a circuit board 4 as a mounting member for second mounting. The package 2 may be mounted on the circuit board 4. The circuit board 4 may be a printed circuit board, which is a rigid substrate, a flexible substrate, or a rigid-flexible substrate. The semiconductor apparatus 3 serving as the photoelectric conversion apparatus may be a camera module including an optical system that guides light to the semiconductor device 1.

The semiconductor apparatus 3 may be mounted on any type of electronic equipment. Electronic equipment 5 includes peripheral devices 6, such as an arithmetic operation device, a memory device, a record device, a communication device, and a display device, in addition to the semiconductor apparatus 3. The peripheral devices are connected to the semiconductor apparatus 3, and directly or indirectly exchange signals. The electronic equipment 5 may be an information terminal, such as a mobile phone or a personal computer; or an image device, such as a camera or a display. Of course, an information terminal equipped with a camera is included.

The detail of an example of the semiconductor device 1 is described with reference to FIG. 2. FIG. 2 is a sectional view of the semiconductor device 1 in a plane containing points P and Q indicated in FIG. 1A. FIG. 2 illustrates the example including the control unit 12 like FIG. 1B.

In the following description, it is assumed that a conductor layer is made of a material with a higher conductivity than that of a semiconductor layer, and an insulator layer is made of a material with a lower conductivity than that of the semiconductor layer.

Also, in the following description for a semiconductor compound and a metal compound, a carbonitride and an oxynitride are included in a nitride, and a nitrocarbide and an oxycarbide are included in a carbide.

First, configurations of the first element part 30 and the first wiring part 31 of the first section 10 are described.

The first element part 30 includes a first semiconductor layer 33. The first semiconductor layer 33 is, for example, a silicon layer. The first element part 30 includes a photodiode PD that is a photoelectric conversion element and is provided at the first semiconductor layer 33, as a semiconductor element forming the photoelectric conversion unit 11 in FIG. 1B. The photodiode PD includes an n-type semiconductor region 34 and a p-type semiconductor region 35 in the first semiconductor layer 33. The first semiconductor layer 33 also has a p-type semiconductor region 32. The photoelectric conversion element may be a photogate. The signal generation circuit, which may be included in the photoelectric conversion unit 11, may be formed of a semiconductor element such as a metal oxide semiconductor (MOS) transistor or the like. FIG. 2 shows a transfer transistor Tr1 having a floating diffusion FD and a reset transistor Tr2 of the photoelectric conversion unit 11. Also, FIG. 2 shows transistors Tr3 and Tr4 as semiconductor elements of the control unit 12 shown in FIG. 1B.

In this example, a portion of a surface 103 of the first semiconductor layer 33 forming the first element part 30 forms an interface with a gate insulating film of the MOS transistors Tr1, Tr2, Tr3, and Tr4. The first element part 30 has an element isolator 38 by, for example, shallow trench isolation (STI) or local oxidation of silicon (LOCOS). The first element part 30 has a first protection film (not shown) formed of an insulator layer, such as silicon nitride or silicon oxide. The first protection film protects the surface 103 of the first semiconductor layer 33. As described above, the first element part 30 may include the element isolator 38, the gate insulating film, a gate electrode, and the first protection film, in addition to the first semiconductor layer 33.

The first wiring part 31 includes a conductor layer and an insulator layer. The first wiring part 31 may have a plurality of wiring levels. A wiring level may have a wiring pattern and a plug. A typical conductor layer forms a wiring pattern. Further, a typical conductor layer forms a main conductive layer with a relatively high current density among the wiring patterns. Also, a typical conductor layer may form an auxiliary conductive layer with a lower current density than that of the main conductive layer among the wiring patterns. The conductor layer may have a via plug for obtaining electrical connection with a lower wiring level (a wiring level of a semiconductor layer), or a contact plug for obtaining electrical connection with the first element part 30.

The via plug and the contact plug may also include the main conductive layer and the auxiliary conductive layer. The auxiliary conductive layer is typically barrier metal. A barrier function of the barrier metal may be a barrier against diffusion between the main conductive layer and the insulator layer, or a barrier against reaction between the main conductive layer and the insulator layer. However, "barrier metal" is a name given to the auxiliary conductive layer for the convenience of understanding, and may not have a barrier function. Even if barrier metal does not need such a barrier function, the barrier metal may be used simply as a base when the main conductive layer is formed, and to reduce electromigration or stressmigration.

The insulator layer may function as an inter-wiring insulating layer that provides insulation between wiring patterns with the same wiring level, and/or an interlayer insulating layer that provides insulation between wiring patterns with different wiring levels. The first wiring part 31 has multiple electric paths (wiring) with two or more wiring levels. Single wiring may include a contact plug, a via plug, and a wiring pattern.

The detailed configuration of the first wiring part 31 is described. The first wiring part 31 includes a contact plug 44a, wiring patterns 40a, 40b, and 40c, and via plugs 44b and 44c. The contact plug, the wiring patterns, and the via plugs formed of the conductor layer form multiple electric paths. The contact plug 44a is mainly formed of a tungsten layer, and has barrier metal including a titanium layer and/or a titanium nitride layer, in addition to the tungsten layer. The wiring patterns 40a, 40b, and 40c, and the via plugs 44b and 44c are each mainly formed of a copper layer, and each have barrier metal including a tantalum nitride layer and/or a tantalum layer, in addition to the copper layer. The wiring pattern 40a is formed of a single copper layer. The wiring pattern 40b and the via plug 44b are integrally formed of a single copper layer. The wiring pattern 40c and the via plug 44c are integrally formed of a single copper layer. First wiring 311 of this example includes the wiring pattern 40c and is connected with the transistor Tr4, which is the semiconductor element provided at the first element part 30, through the contact plug 44a, the wiring patterns 40a and 40b, and the via plugs 44b and 44c.

The first wiring part 31 includes insulator layers 39a, 39b, 39c, 39d, and 39e each serving as an interlayer insulating layer or an inter-wiring insulating layer and made of silicon oxide. The insulator layer 39b is an inter-wiring insulating layer for the wiring pattern 40a. The insulator layers 39a, 39b, 39c, and 39d are located between the wiring pattern 40c and the first semiconductor layer 33. The wiring pattern 40c is located between the insulator layer 39e and the first semiconductor layer 33. The first wiring part 31 may further include insulator layers (not shown) made of silicon nitride, silicon carbide, or the like, as diffusion prevention layers for copper contained in the wiring patterns 40a, 40b, and 40c. The insulator layers may be each arranged between the interlayer insulating layer and the wiring pattern. The diffusion prevention layer may have a smaller thickness than that of the interlayer insulating layer or the inter-wiring insulating layer.

Next, configurations of the second element part 50 and the second wiring part 51 of the second section 20 are described.

The second element part 50 includes a second semiconductor layer 55, and has MOS transistors Tr5, Tr6, Tr7, and Tr8 serving as semiconductor elements forming the signal processing unit 22. In this example, a portion of a surface 203 of the second semiconductor layer 55 forms an interface with a gate insulating film of the MOS transistors Tr5, Tr6, Tr7, and Tr8. The second element part 50 has an element isolator 58 by, for example, STI or LOCOS. The second element part 50 has a second protection film (not shown) formed of an insulator, such as silicon nitride or silicon oxide. The second protection film protects the surface 203 of the second semiconductor layer 55. The second element part 50 may include the element isolator 58, the gate insulating film, a gate electrode, and the second protection film, in addition to the second semiconductor layer 55.

The second wiring part 51 includes a conductor layer and an insulator layer. The conductor layer and the insulator layer of the second wiring part 51 have functions similar to the conductor layer and the insulator layer of the first wiring part 31.

The detailed configuration of the second wiring part 51 is described. The second wiring part 51 includes a contact plug 54a, a plurality of wiring patterns 53a, 53b, and 53c, and via plugs 54b and 54c. The contact plug, the wiring patterns, and the via plugs formed of the conductor layers form multiple electric paths. The contact plug 54a and the via plug 54c are each mainly formed of a tungsten layer, and each have barrier metal including a titanium layer and/or a titanium nitride layer, in addition to the tungsten layer. The wiring patterns 53a and 53b, and the via plug 54b are each mainly formed of a copper layer, and each have barrier metal including a tantalum nitride layer and/or a tantalum layer, in addition to the copper layer. The wiring pattern 53a includes a single copper layer. The wiring pattern 53b and the via plug 54b are integrally formed of a single copper layer. The wiring pattern 53c is mainly formed of an aluminum layer, and has barrier metal including a titanium layer and/or a titanium nitride layer, in addition to the aluminum layer. Second wiring 512 of this example includes the wiring pattern 53c and is connected with the transistor Tr5, which is the semiconductor element provided at the second element part 50, through the contact plug 54a, the wiring patterns 53a and 53b, and the via plugs 54b and 54c.

The second wiring part 51 includes insulator layers 49a, 49b, 49c, 49d, and 49e each serving as an interlayer insulating layer or an inter-wiring insulating layer, and made of silicon oxide. The insulator layer 49b is an inter-wiring insulating layer for the wiring pattern 53a. The insulator layers 49a, 49b, 49c, and 49d are located between the wiring pattern 53c and the second semiconductor layer 55. The wiring pattern 53c is located between the insulator layer 49e and the second semiconductor layer 55. The second wiring part 51 may further include insulator layers (not shown) made of silicon nitride or silicon carbide, as diffusion prevention layers for copper contained in the wiring patterns 53a and 53b. The insulator layers may be each arranged between the interlayer insulating layer and the wiring pattern.

In the wiring patterns 40a, 40b, 40c, 53a, and 53b, and the plugs 44a, 44b, 44c, 54a, 54b, and 54c, the copper layer, the tungsten layer, and the aluminum layer function as main conductive layers with relatively high conductivities among the wiring. Each main conductive layer is made of a material with a higher conductivity and a larger sectional area in a current flow direction than those of the auxiliary conductive layers, such as the tantalum layer, the tantalum nitride layer, the titanium layer, and the titanium nitride layer used for the barrier metal.

In the example, the wiring patterns 40a, 40b, 40c, 53a, and 53b are mainly formed of the copper layers; however, wiring patterns mainly formed of aluminum layers, such as the wiring pattern 53c, may be employed. The copper layer does not have to be made of only copper, and the aluminum layer does not have to be made of only aluminum. The copper layer and the aluminum layer may be made of alloys with other metal added. For example, the copper layer may contain aluminum or silicon as an additive by an amount smaller than the amount of copper. The aluminum layer may contain copper or silicon as an additive by an amount smaller than the amount of aluminum. In the example, the insulator layers 39a, 39b, 39c, 39d, 39e, 49a, 49b, 49c, 49d, and 49e are made of silicon oxide; however, may use silicate glass such as borosilicate glass (BSG), phosphosilicate glass (PSG), or borophosphosilicate glass (BPSG). Also, a material with a lower dielectric constant (a low-k material) than that of silicon oxide may be used.

In the example, the first wiring part 31 has the wiring patterns of the three levels including the wiring patterns 40a, 40b, and 40c, and the second wiring part 51 has the wiring patterns of the three levels including the wiring patterns 53a, 53b, and 53c. However, the number of levels for the wiring patterns may be desirably set and the number of levels for the first wiring part 31 may differ from the number of levels for the second wiring part 51. For example, the number of levels for the wiring patterns of the second wiring part 51 may be larger than the number of levels for the wiring patterns of the first wiring part 31.

Then, other structure of the semiconductor device 1 is described.

The first section 10 and the second section 20 are joined by the first wiring part 31 and the second wiring part 51. The insulator layer 39e of the first wiring part 31 and the insulator layer 49e of the second wiring part 51 are joined through a joining surface 60. Accordingly, the insulator layer 39e and the insulator layer 49e are located between the first wiring 311 and the second wiring 512 (between the wiring pattern 40c and the wiring pattern 53c).

The semiconductor device 1 of this example forms a backside-illumination photoelectric conversion apparatus in which a surface (a back surface 104) opposite to the surface (the surface 103) provided with the transistors Tr1 to Tr4 of the first semiconductor layer 33 serves as a light-receiving surface. In the backside-irradiation photoelectric conversion apparatus, the first semiconductor layer 33 of the first section 10 has a thickness smaller than 10 μm, and is, for example, in a range from 2 to 5 μm. The second semiconductor layer 55 has a larger thickness than that of the first semiconductor layer 33. The second semiconductor layer 55 functions as a supporting member for the first semiconductor layer 33. The second semiconductor layer 55 has a thickness of 10 μm or larger, and is, for example, in a range from 20 to 500 μm.

An optical member 41 is provided at the back surface 104 of the first semiconductor layer 33.

The optical member 41 includes an antireflection layer 61, an insulator layer 62, a light-shielding layer 63, an insulator layer 69, a planarization layer 71, a color filter (a color-filter array) 73, and an on-chip lens (a microlens array) 74. The optical member 41 contacts the back surface 104 of the first semiconductor layer 33, the back surface 104 forming the light-receiving surface of the first element part 30. A surface 401 of the optical member 41 opposite to the surface near the first element part 30 is a light incidence surface. In this example, the light incidence surface is formed of the on-chip lens 74.

An electrode pad 78 is arranged in the layer with the same level as the level of the wiring pattern 53c. An opening 77 is provided above the electrode pad 78. The opening 77 penetrates through the plurality of insulator layers, the first semiconductor layer 33, and the optical member 41. The opening 77 is provided with a bonding wire 79 connected to the electrode pad 78. The wire bonding is connected to an internal terminal of the package. The connection between the semiconductor device 1 and the package is not limited to the wire bonding connection and may use flip-chip connection.

The semiconductor device 1 is provided with a conductive member 68 that mutually connects the first wiring 311 and the second wiring 512. The conductive member 68 of this embodiment includes a first through part 65, a second through part 66, and a coupling part 67 that connects the through parts.

The first through part 65 penetrates through the first element part 30 and is connected with the first wiring 311 of the first wiring part 31. The second through part 66 penetrates through the first element part 30 and the first wiring part 31, and is connected with the second wiring part 51 of the second section 20. The first through part 65 penetrates through the first element part 30, however, does not penetrate through the first wiring part 31. Hence, the first through part 65 does not penetrate through the first section 10. In contrast, the second through part 66 penetrates through the first element part 30 and the first wiring part 31, and hence penetrates through the first section 10. The first through part 65, the second through part 66, and the coupling part 67 are made of a conductive material to attain electrical connection between the first wiring 311 and the second wiring 512. However, the first through part 65, the second through part 66, and the coupling part 67 may be made of a plurality of kinds of conductive materials.

Another form of the conductive member 68 may be a form in which the first through part 65 and the second through part 66 are integrated. For such a form, see a through connection conductor (84) depicted in FIG. 15 of Japanese Patent Laid-Open No. 2010-245506, and an inter-substrate wiring (80) depicted in FIG. 21 of Japanese Patent Laid-Open No. 2011-096851.

Also, in this example, the first through part 65 contacts the wiring pattern 40c, and the second through part 66 contacts the wiring pattern 53c. However, it is not limited thereto. The first through part 65 may contact one or a plurality of the wiring patterns 40a, 40b, and 40c. The second through part 66 may contact one or a plurality of the wiring patterns 53a, 53b, and 53c. Also, the first through part 65 and the second through part 66 may contact a conductive layer (a copper layer or an aluminum layer) of a wiring pattern, or may contact a barrier metal layer (a titanium layer, a titanium nitride layer, or a tantalum layer) of a wiring pattern. Also, either through part may penetrate through a conductor layer of barrier metal of a wiring pattern, and contact a conductor layer.

The conductive member 68 is surrounded by an insulating region 42 provided in the first semiconductor layer 33. The insulating region 42 may be a gas region or a vacuum region. The conductive member 68 provides electrical connection between the photoelectric conversion unit 11 and the signal processing unit 22, between the photoelectric conversion unit 11 and the control unit 21, and between the control unit 12 and the signal processing unit 22. A block 90 shown in FIG. 2 indicates a region including the conductive member 68, the first wiring 311, the second wiring 512, and the insulating region 42 relating to the connection between the sections. A plurality of the blocks 90 may be arranged in parallel. If the plurality of blocks 90 are arranged in parallel, signals per column or signals per row of the photoelectric conversion unit 11 can be handed to the signal processing unit 22, and the signal processing unit 22 can process the electric signals based on a signal carrier generated in the photoelectric conversion unit 11. Alternatively, the blocks 90 may be arranged in series, or may be arranged in series and in parallel.

A cap layer 70, which is made of silicon nitride or silicon carbide, is provided on the conductive member 68. The cap layer 70 may function as a protection layer that prevents the conductive member 68 from being corroded due to moisture or the like from the outside.

Described above is the example of the configuration of the semiconductor device 1. The configuration may be properly modified.

The conductive member 68 is described below in detail.

The conductive member 68 of this embodiment contains metal having a higher diffusion coefficient to a semiconductor (silicon) of the first semiconductor layer 33 than a diffusion coefficient of oxygen to the semiconductor (silicon). Hereinafter, such metal is defined as "high-diffusion metal." This high-diffusion metal may function as a conductive material to attain electrical connection between the first wiring 311 and the second wiring 512. A region containing the high-diffusion metal in the conductive member 68 is called high-diffusion metal region 681 (a first region).

As the diffusion coefficient is high, the substance may be more likely diffused into the subject material. The diffusion coefficient may have temperature dependency. A temperature at which comparison is made between diffusion coefficients is within a range of temperatures to which the conductive member 68 is exposed during manufacturing or use of the semiconductor device 1, because the comparison with the diffusion coefficient of oxygen at a temperature to which the conductive member 68 is not exposed is meaningless. The first semiconductor layer 33 in this example is a silicon layer. Hence, correlations among diffusion coefficients of typical materials to silicon are exemplified. Metal with a higher diffusion coefficient to silicon than the diffusion coefficient of oxygen to silicon may be gold, silver, copper, nickel, iron, and zinc. Metal with a lower diffusion coefficient to silicon than the diffusion coefficient of oxygen to silicon may be aluminum, tungsten, bismuth, and tin. Nonmetal and semimetal with a higher diffusion coefficient to silicon than the diffusion coefficient of oxygen to silicon may be hydrogen and sulfur. Nonmetal and semimetal with a lower diffusion coefficient to silicon than the diffusion coefficient of oxygen to silicon may be carbon, boron, arsenic, antimony, and phosphorus.

A diffusion barrier region 682 (a second region) is provided between the high-diffusion metal region 681 and a near region located near the high-diffusion metal region 681. The diffusion barrier region 682 restricts diffusion of the high-diffusion metal from the high-diffusion metal region 681 to the near region. The layer serving as the near region located near the high-diffusion metal region 681 may be the first semiconductor layer 33 through which the first through part 65 and the second through part 66 of the conductive member 68 penetrate. Also, the layer serving as the near region may be the insulator layers 39a, 39b, 39c, and 39d (a first insulator layer) provided as the interlayer insulating layers in the first wiring part 31. Also, the layer serving as the near region may be the insulator layer 39e (a third insulator layer) provided in the first wiring part 31, and the insulator layer 49e (a third insulator layer) provided in the second wiring part 51, through which the second through part 66 of the conductive member 68 penetrates. Alternatively, the layer serving as the near region may be the first semiconductor layer 33, the back surface 104 of which faces the coupling part 67. Also, the layer serving as the near region may be the conductor layer (a first conductor layer) of the wiring pattern 40c of the first wiring 311, to which the first through part 65 of the conductive member 68 contacts. Also, the layer serving as the near region may be the conductor layer (a second conductor layer) of the wiring pattern 53c of the second wiring 512, to which the second through part 66 of the conductive member 68 contacts. Alternatively, the layer serving as the near region may be the insulator layers 49a, 49b, 49c, and 49d (a second insulator layer) provided between the wiring pattern 53c and the second semiconductor layer 55.

If the first through part 65 and the second through part 66 have the high-diffusion metal region 681, the diffusion barrier region 682 is located between the high-diffusion metal region 681 and the near region. The diffusion barrier region 682 contains at least one kind of diffusion barrier material. The diffusion barrier material is a material different from the high-diffusion metal.

A diffusion coefficient of the high-diffusion metal to the diffusion barrier material is lower than a diffusion coefficient of the high-diffusion metal to a semiconductor (silicon). Also, the diffusion coefficient of the high-diffusion metal to the diffusion barrier material is lower than a diffusion coefficient of the high-diffusion metal to an insulator (silicon oxide) of the first insulator layer. In short, the high-diffusion metal is less diffused to the diffusion barrier material as compared with the semiconductor and insulator in the near region. If the high-diffusion metal is gold, silver, or copper, the semiconductor in the near region is silicon, and the insulator in the near region is silicon oxide, the diffusion barrier material may be tantalum, tantalum nitride, tantalum carbide, titanium, titanium nitride, titanium carbide, tungsten, tungsten nitride, tungsten carbide, manganese, silicon nitride, or silicon carbide. As described above, the diffusion barrier material may be metal, metal nitride, metal carbide, a semiconductor nitride, or a semiconductor carbide.

As described above, the first wiring part 31 may include an insulator layer serving as a diffusion prevention layer such as a silicon nitride layer or a silicon carbide layer for a wiring material, in addition to a silicon oxide layer. The diffusion coefficient of the high-diffusion metal to the diffusion barrier material may be equal to or lower than the diffusion coefficient of the high-diffusion metal to an insulator (silicon nitride or silicon carbide) of the diffusion prevention layer. However, it is not limited thereto. The material of the diffusion prevention layer may be the same as the diffusion barrier material of the diffusion barrier region 682. If the diffusion prevention layer has a smaller thickness than that of the interlayer insulating layer, the influence of diffusion of the high-diffusion metal in the conductive member 68 against the diffusion prevention layer may not be taken into consideration.

In this example, the conductive member 68 includes the diffusion barrier region 682 that restricts diffusion of copper, which is the high-diffusion metal contained in the conductive member 68, to the first section 10, as a portion of the conductive member 68. In this example, the high-diffusion metal, diffusion of which is blocked by the diffusion barrier region 682, is copper. The high-diffusion metal may be likely diffused to silicon, which is the material of the first semiconductor layer 33 forming a major portion of the first element part 30, and silicon oxide, which is the material of the insulator layers 39a to 39e forming a major portion of the first wiring part 31. The diffusion coefficient of the high-diffusion metal to the diffusion barrier region 682 is lower than the diffusion coefficient of the high-diffusion metal to the material (silicon) of the first semiconductor layer 33 and an oxide (silicon oxide) of the material.

The arrangement of the diffusion barrier region 682 is described in detail. A portion (a first portion) of the diffusion barrier region 682 is located between the portion containing the high-diffusion metal of the first through part 65 and the first section 10, and restricts diffusion of the portion containing the high-diffusion metal of the first through part 65 to the first section 10. A portion (a second portion) of the diffusion barrier region 682 is located between the region containing the high-diffusion metal of the second through part 66 and the first section 10, and restricts diffusion of the region containing the high-diffusion metal of the second through part 66 to the first section 10. A portion (a third portion) of the diffusion barrier region 682 is located between the region containing the high-diffusion metal of the coupling part 67 and the first section 10, and restricts diffusion of the metal of the coupling part 67 to the first section 10. The first portion, the second portion, and the third portion of the diffusion barrier regions 682 form a portion of the first through part 65, a portion of the second through part 66, and a portion of the coupling part 67, respectively.

The diffusion barrier material is an insulating material or a conductive material. If the diffusion barrier material is a conductive material, the conductive material may serve as part of electrical connection between the first wiring 311 and the second wiring 512, as a portion of the conductive member 68. If the diffusion barrier material is an insulating material, the insulating material is located between the conductive member 68 and the first section 10 or the second section 20. The diffusion barrier material may be formed of both of an insulating material and a conductive material.

The diffusion barrier region 682 may have a single-layer structure or a multi-layer structure. The single-layer structure may be an insulating layer or a conductive layer. The multi-layer structure may include only conductive layers or insulating layers, or may include both of insulating layers and conductive layers. The diffusion barrier region 682 of this embodiment is formed of a conductive material, is a portion of the conductive member 68, and has a single-layer structure of a tantalum layer. In this embodiment, a portion of the diffusion barrier region 682 is located between the high-diffusion metal region 681 of the first through part 65 and the first wiring 311, and contacts the wiring pattern 40c. Also, a portion of the diffusion barrier region 682 is located between the high-diffusion metal region 681 of the second through part 66 and the second wiring 512, and contacts the wiring pattern 53c. If the diffusion barrier region 682 has a multi-layer structure including conductive layers and insulating layers, at least an insulating layer is not arranged between the high-diffusion metal region 681 of the first through part 65 and the first wiring 311. Similarly, an insulating layer of the diffusion barrier region 682 is not arranged between the high-diffusion metal region 681 of the second through part 66 and the second wiring 512. An insulating layer may be arranged between a conductive layer of the diffusion barrier region 682 and the conductive member 68. The first wiring part 31 is provided with the via plugs 44b and 44c having barrier metal (a tantalum film) that blocks diffusion of metal (copper) with the same atomic number as that of the metal (copper) contained in the second through part 66 in the first section 10. For example, when $T_1$ is a thickness of the barrier metal of the via plug 44b and $T_0$ is a thickness of the conductive layer of the diffusion barrier region 682 at the same height as the height of the via plug 44b, the thickness of the conductive layer of the diffusion barrier region 682 may be determined to satisfy $T_1 < T_0$. The thickness of the conductive layer of the diffusion barrier region 682 at the same height as the height of the via plug 44c may be similarly larger than the thickness of the barrier metal of the via plug 44c. Provided below is the reason that the thickness of the conductive layer of the high-diffusion metal region 681 formed at the first through part 65 and the second through part 66 can be larger than the thickness of the barrier metal formed at the via plug 44b of the first wiring part 31 and the via plug 54b of the second wiring part 51. If the thickness of the barrier metal formed at the via plugs 44b and 54b is increased, a tolerance for electromigration (EM) may be degraded, and a via resistance may be increased. In contrast, the dimensions of the first through part 65 and the second through part 66 are several times larger. Accordingly, since the current density is low, the tolerance for EM resistance is improved, and since the sectional area is large, the resistance is decreased. Hence, the thickness of the conductive layer of the high-diffusion metal region 681 formed at the first through part 65 and the second through part 66 may be increased.

Also, the first wiring part 31 is provided with a via plug having barrier metal (a tantalum film) that blocks diffusion of metal (Cu) with the same atomic number as that of the metal (Cu) contained in the second through part 66 in the first section 10. For example, the via plug is the via plug 44b. It is assumed that $D_1$ is a width of the via plug 44b, $T_1$ is a thickness of the barrier metal (the tantalum film) of the via plug 44b, $D_0$ is a width of the conductive member 68 (the first through part 65 or the second through part 66) at the same height as the height of the via plug 44b, and $T_0$ is a thickness of the conductive layer of the diffusion barrier region 682 at the same height as the height of the via plug 44b. In this example, the width of the first through part 65 or the second through part 66, and the thickness of the conductive layer of the diffusion barrier region 682 can be determined to satisfy $T_0/D_0<T_1/D_1$. If the diffusion barrier material is selected based on the above-described guideline, the rate of the thickness of the conductive layer of the diffusion barrier region 682 at the conductive member 68 may be smaller than the rate of the thickness of the barrier metal at the via plug.

Also, when $D_{1C}$ is a width of the contact plug 44a provided at the first wiring part 31 and $T_C$ is a thickness of the conductive layer of the diffusion barrier region 682 at the same height as the height of the contact plug 44a, $T_C/D_{1C}$ may be established. The high-diffusion metal region 681 can ensure conductivity even if the thickness $T_C$ of the conductive layer of the diffusion barrier region 682 is not so large.

When $D_{1C}$ is a width of the contact plug 44a provided at the first wiring part 31 and $D_2$ is a width of the contact plug 54a provided at the second wiring part 51, $D_{2C}<D_{1C}$ may be established. The first section 10 and the second section 20 may be individually formed, because the second section 20 can be formed under a finer process rule than that of the first section 10. $D_{1C} \le D_{2C}$ may be established if required. $T_C<D_{2C}$ may be established, and $T_C<D_{2C}<D_{1C}$ may be established.

The diffusion barrier region 682 restricts diffusion of the high-diffusion metal of the high-diffusion metal region 681 to the first semiconductor layer 33. Consequently, leak current, which is possibly generated in the transistors Tr1 to Tr4 of the first element part 30, or dark current, which is possibly generated in the photoelectric conversion element PD of the first element part 30, can be reduced. Also, the diffusion barrier region 682 restricts diffusion of the high-diffusion metal of the high-diffusion metal region 681 to the insulator layers 39a to 39e. Hence, generation of a void in the high-diffusion metal region 681 due to the diffusion of the high-diffusion metal from the high-diffusion metal region 681 is restricted. Also, a decrease in resistance of the insulator layers 39a to 39e due to the diffusion of the high-diffusion metal to the insulator layers 39a to 39e is restricted. Accordingly, reliability of the wiring structure of the first wiring part 31 is ensured.

Figures 1, 3A:
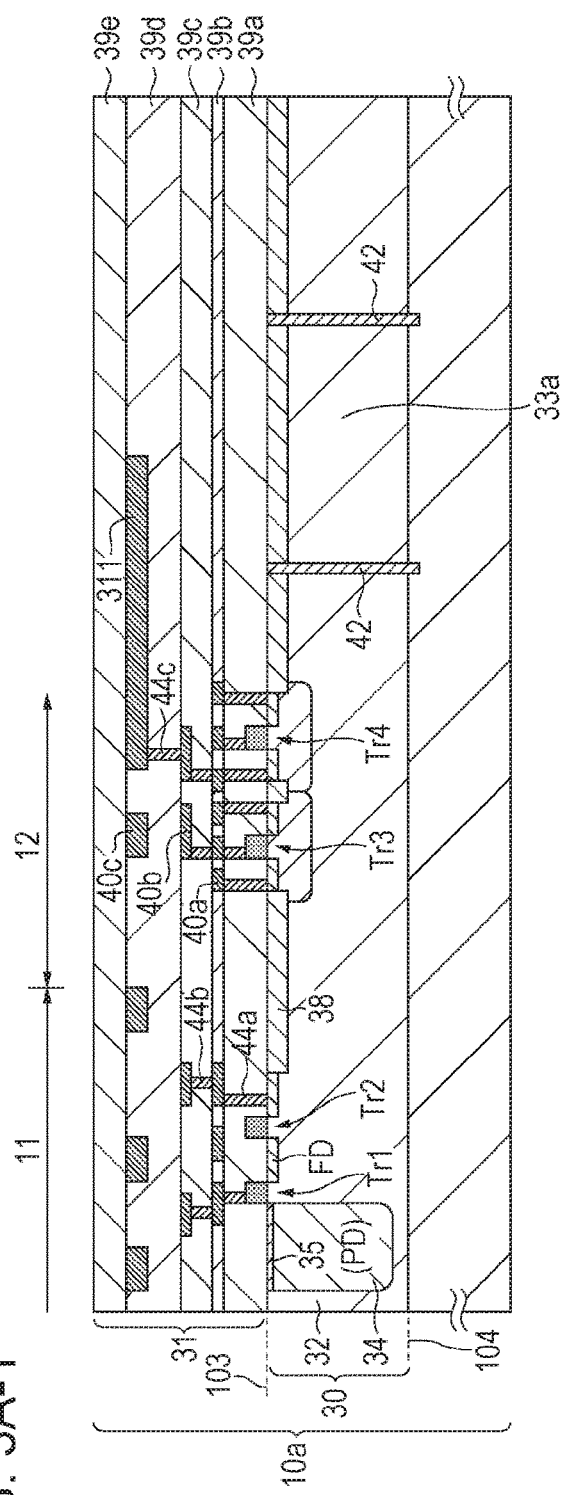
Figures 2, 3A:
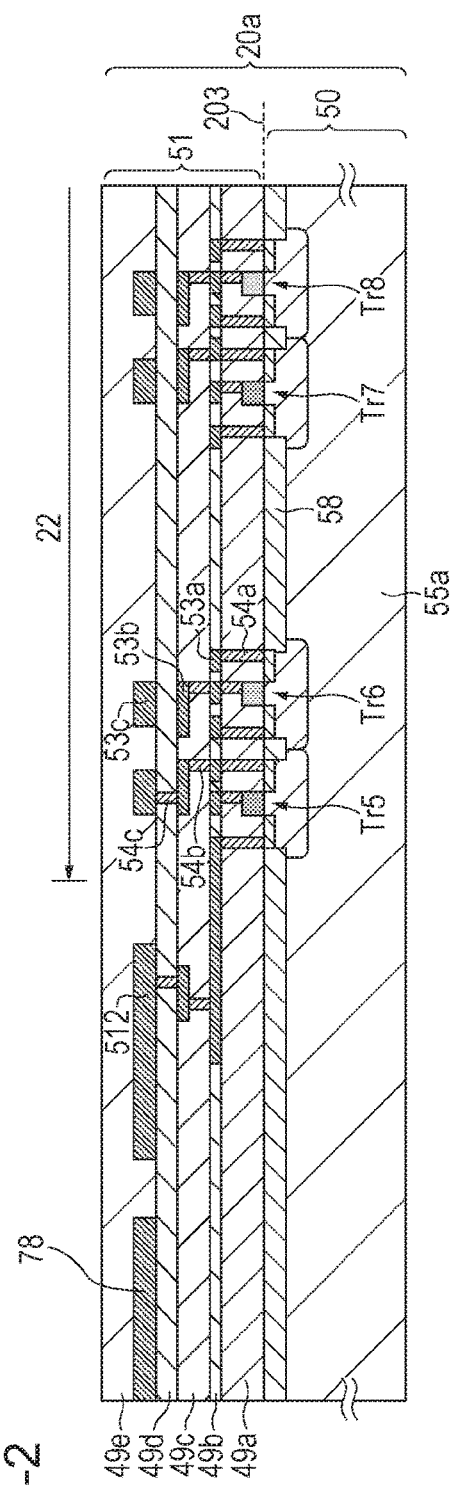

A manufacturing method of the photoelectric conversion apparatus of this embodiment is described with reference to FIGS. 3A-1, 3A-2, 3B, 4C, 4D, 5E, and 5F. FIGS. 3A-1 to 5F are sectional views showing a part similar to FIG. 2 (a plane containing the points P and Q in FIG. 1A).

A manufacturing process of a first section 10a is described with reference to FIG. 3A-1.

First, the first element part 30 is formed. Specific description is given below. A first semiconductor substrate 33a, which becomes the first semiconductor layer 33, is prepared. The first semiconductor substrate 33a is, for example, a silicon substrate. The insulation region 42, which isolates a desirable region of the first semiconductor substrate 33a, is formed. The insulating region 42 is formed at a position surrounding the conductive member 68 in FIG. 2. The insulating region 42 is formed to a depth below the lower surface (the back surface) 104 of the first semiconductor layer 33 in FIG. 2. The insulating region 42 is formed by making an opening at the desirable position of the upper surface (the front surface) 103 of the first semiconductor substrate 33a from the upper surface, and embedding an insulating material in the opening. Alternatively, the insulating region 42 may be formed by forming a deep trench at the desirable position of the upper surface (the front surface) 103 of the first element part 30 from the upper surface, and capping the deep trench, so that at least a portion of the trench contains gas or becomes hollow.

Then, the element isolator 38 is formed on the upper surface (the surface) 103 of the first semiconductor substrate, and wells for the transistors Tr3 and Tr4 are formed in the first semiconductor substrate. Then, the n-type semiconductor region 34 and the p-type semiconductor region 35 for the photoelectric conversion unit, and an n-type semiconductor region and a p-type semiconductor region for the transistors Tr1, Tr2, Tr3, and Tr4 are formed. Also, the gate electrode is formed on the first semiconductor substrate through a gate oxide film. Then, a first protection film (not shown) that protects the surface 103 of the first semiconductor substrate is formed to cover the gate electrode. In this way, the first element part 30 is formed.

Then, the first wiring part 31 is formed on the first element part 30. Specific description is given below. First, the insulator layer 39a is formed on the first semiconductor substrate 33a through the first protection film, and a contact hole is formed in the first protection layer and the insulator layer 39a. A titanium layer and a titanium nitride layer, which serve as an auxiliary conductive layer, and a tungsten layer, which serves as a main conductive layer, are formed in the contact hole, and hence the contact plug 44a is formed. The contact plug 44a has dimensions, for example, a width of 130 nm and a length (a depth of the contact hole) of 200 nm.

Then, the insulator layer 39b is formed, and a groove (a trench) for single damascene is formed in the insulator layer 39b. Then, the wiring pattern 40a is formed by forming a tantalum layer serving as an auxiliary conductive layer, and a copper layer serving as a main conductive layer, by using a single damascene method. Then, a diffusion prevention layer (not shown) made of, for example, silicon nitride or silicon carbide, is deposited by a thickness of 50 nm.

Then, the insulator layer 39c is formed as an interlayer insulating layer, and a hole (a via) for dual damascene is formed in the insulator layer 39c by patterning. The groove (the via) has dimensions, for example, a width of 150 nm, and a depth of 300 nm. Then, a groove (a trench) for dual damascene is formed in the insulator layer 39c by patterning. Then, for example, a tantalum film with a thickness of 10 nm and a copper seed film with a thickness of 100 nm are deposited, and hence, for example, a copper-plated film with a thickness of 900 nm is formed. Then, an excessive portion of the film outside the trench is removed by chemical mechanical planarization (CMP). As described above, the via plug 44b and the wiring pattern 40b are integrally formed by using a dual damascene method. Then, a diffusion prevention film (not shown) with a thickness of 50 nm is deposited. Similarly, the insulator layer 39d is formed, and the via plug 44c and the wiring pattern 40c are integrally formed by the dual damascene method. Then, the insulator layer 39e made of silicon oxide is formed.

In this way, the first section 10a including the first element part 30 and the first wiring part 31 is obtained.

A manufacturing process of a second section 20a is described with reference to FIG. 3A-2.

First, the second element part 50 is formed. Specific description is given below. First, a second semiconductor substrate 55a, which becomes the second semiconductor layer 55, is prepared. The second semiconductor substrate 55a is, for example, a silicon substrate. The element isolator 58 is formed on the upper surface (the surface) 203 of the second semiconductor substrate. Then, wells for the transistors Tr5, Tr6, Tr7, and Tr8 are formed in the second semiconductor substrate. Then, an n-type semiconductor region and a p-type semiconductor region for the transistors Tr5, Tr6, Tr7, and Tr8 are formed. Also, the gate electrode is formed on the second semiconductor substrate through a gate oxide film. Then, a second protection film (not shown) that protects the surface 203 of the second semiconductor substrate is formed to cover the gate electrode. In this way, the second element part 50 is formed.

Then, the second wiring part 51 is formed on the upper surface (the surface) 203 of the second element part 50. The contact plug 54a and the via plug 54c may be formed similarly to the contact plug 44a. The contact plug 54a has dimensions, for example, a width of 65 nm and a height (a depth of the contact hole) of 100 nm. The wiring pattern 53a may be formed similarly to the wiring pattern 40a. The wiring pattern 53b and the via plug 54b may be formed similarly to the wiring pattern 40b and the via plug 44b. In this case, the three wiring levels are provided. However, the number of wiring levels of the second wiring part 51 may be larger than that of the first wiring part 31. The wiring pattern 53c may be formed by patterning a laminated body of a titanium layer and/or a titanium nitride layer, an aluminum layer, and a titanium layer and/or a titanium nitride layer.

In this way, the second section 20a including the second element part 50 and the second wiring part is obtained. Any of the first section 10a and the second section 20a may be fabricated first, or both the first section 10a and the second section 20a may be fabricated simultaneously.

Figure 3B:
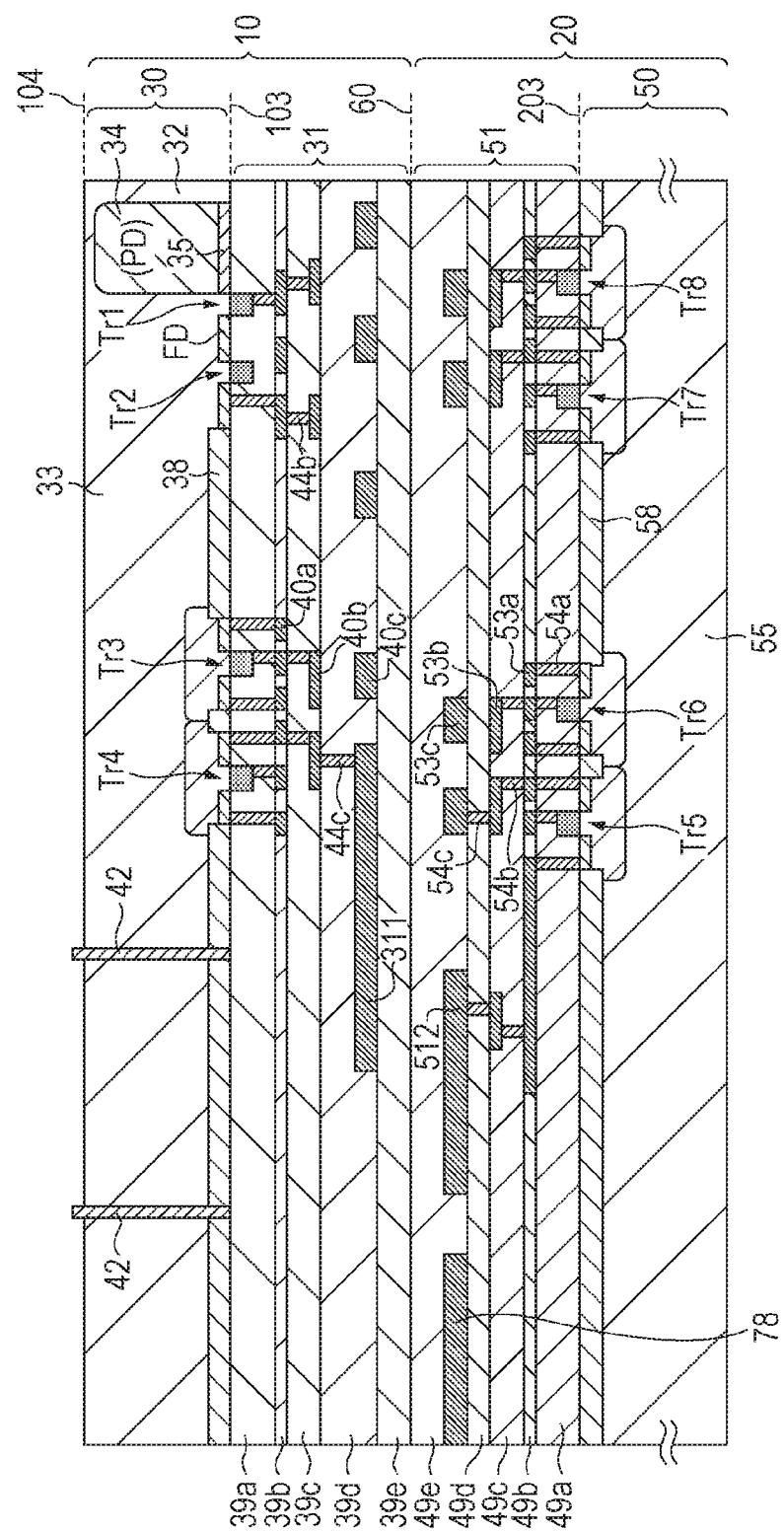

The description is continued with reference to FIG. 3B. The first wiring part 31 of the first section 10a and the second wiring part 51 of the second section 20a are joined at the joining surface 60. A surface of the first wiring part 31 (a surface of the insulator layer 39e) of the first section 10a and a surface of the second wiring part 51 (a surface of the insulator layer 49e) of the second section 20a are formed of insulating layers, and are planarized by CMP or etch back. The first section 10a and the second section 20a may be joined in vacuum or in an atmosphere of inert-gas. Also, before the joining, plasma irradiation may be provided on the surface of the first wiring part 31 (the surface of the insulator layer 39e) of the first section 10a and the surface of the second wiring part 51 (the surface of the insulator layer 49e) of the second section 20a. If the plasma irradiation is provided, the junction between silicon oxide films or silicon nitride films becomes more rigid as compared with a case without plasma irradiation. Also, a method of activating the joining surface by processing with a chemical solution may be applied instead of plasma irradiation.

In this embodiment, the example is provided in which the first wiring part 31 and the second wiring part 51 are directly joined by plasma joining or the like. However, the insulator layer of the first wiring part 31 and the insulator layer of the second wiring part 51 may be joined through an adhesive layer. Alternatively, a conductor layer of the first wiring part 31 and a conductor layer of the second wiring part 51 may be directly joined by metal joining. The material of the conductor layer for metal joining may use copper.

Further, the first semiconductor substrate of the first element part 30 of the first section 10a after the joining is reduced in thickness from a lower surface (a back surface). The thickness may be reduced by, for example, polishing, CMP, or etching. By reducing the thickness to the surface 104, the first section 10 including the first element part 30 having the first semiconductor layer 33, which is the configuration of FIG. 3B, can be obtained. By reducing the thickness of the first semiconductor layer 33, incident light efficiently reaches the photoelectric conversion unit 11. This contributes to an increase in sensitivity.

In this way, the laminated body of the first section 10 and the second section 20 is obtained.

Figure 4C:
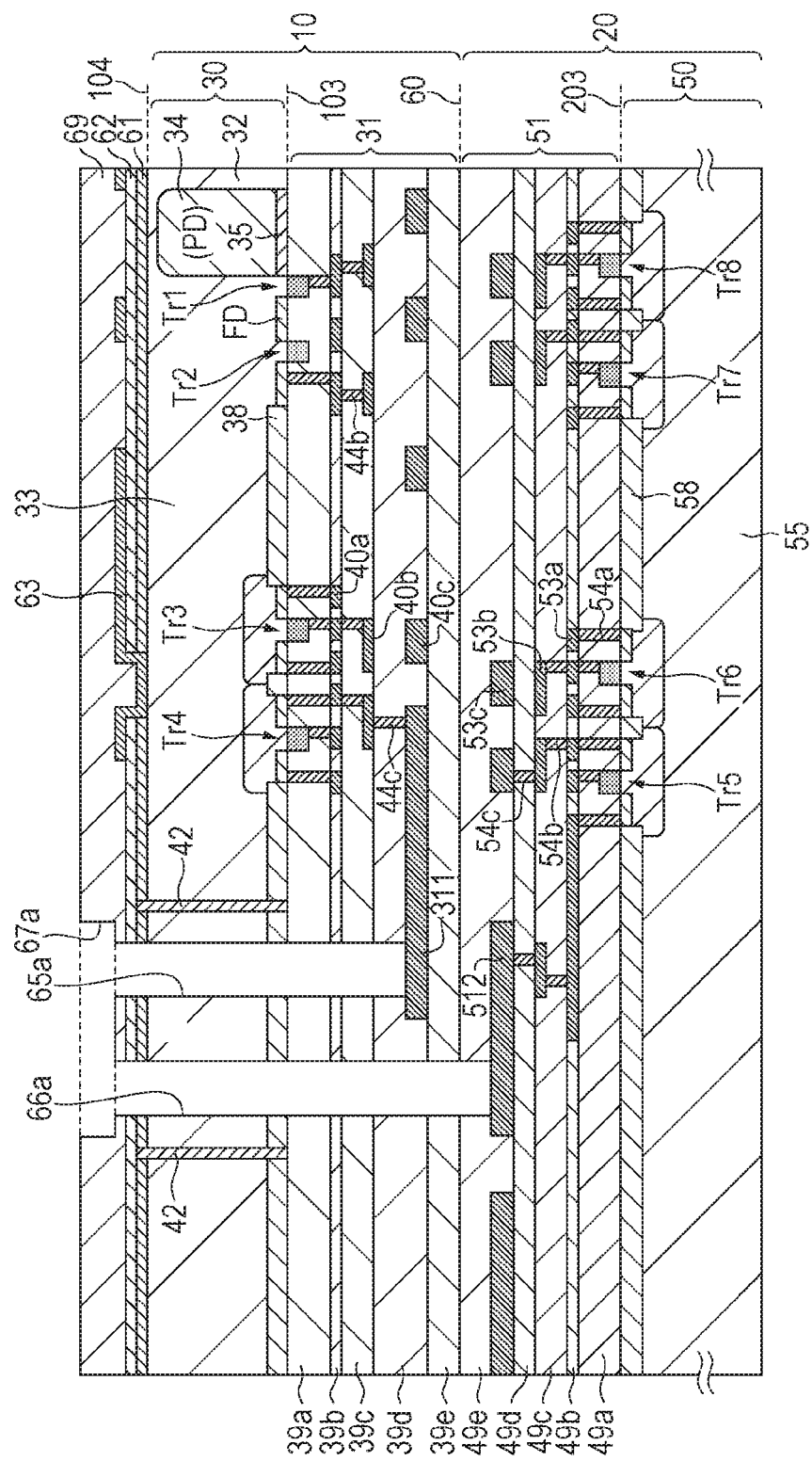
FIGS. 4C and 4D are schematic illustrations showing the example of the manufacturing method of the semiconductor apparatus.

The description is continued with reference to FIG. 4C. The antireflection layer 61 and the insulator layer 62 are formed on the surface 104 of the first semiconductor layer 33 with the reduced thickness. Then, the light-shielding layer 63 is formed. The antireflection layer 61 may have a refractive index between refractive indices of a silicon layer and a silicon oxide layer. The antireflection layer 61 may be formed of, for example, silicon nitride. A plurality of the antireflection layers 61 may be provided. The insulator layer 62 is made of, for example, silicon oxide. The light-shielding layer 63 may be formed by depositing aluminum or tungsten, and performing patterning. The light-shielding layer 63 may be arranged between pixels, on an optical black pixel, and on an element that is affected by incidence of light. Before the light-shielding layer 63 is deposited, by patterning the antireflection layer 61 and the insulator layer 62 and then depositing the light-shielding layer 63, the light-shielding layer 63 and the first element part 30 may be brought into electrical connection.

Further, the insulator layer 69 is formed on the insulator layer 62 and the light-shielding layer 63. The insulator layer 69 is formed of, for example, a silicon oxide film. Then, a desirable region of the insulator layer 69 inside the insulating region 42 is patterned, and hence a coupling groove 67a is formed. The coupling groove 67a is formed, for example, by a depth not to reach the first element part 30. In a bottom surface of the coupling groove 67a, a first through hole 65a that reaches the first wiring 311 and a second through hole 66a that reaches the second wiring 512 are formed. The first through hole 65a is formed by etching the insulator layer 69, the insulator layer 62, the antireflection layer 61, the first element part 30, the element isolator 38, the first protection film of the first wiring part 31, and the insulator layers 39a, 39b, 39c, and 39d of the first wiring part 31. Then, the first through hole 65a reaches the wiring pattern 40c of the first wiring part 31. The second through hole 66a is formed by etching the insulator layer 69, the insulator layer 62, the antireflection layer 61, the first element part 30, the element isolator 38, the first protection film, the insulator layers 39a, 39b, 39c, and 39d of the first wiring part 31, and the insulator layer 49e. Then, the second through hole 66a is formed to reach the wiring pattern 53c of the second wiring part 51. The first through hole 65a and the second through hole 66a each have dimensions of, for example, a width in a range from 1 to 3 µm, and a depth in a range from 3 to 8 µm. The first through hole 65a and the second through hole 66a have depths several times larger than those of the via plugs 44b and 54b formed in the first wiring part 31 and the second wiring part 51. The first through hole 65a and the second through hole 66a may be formed simultaneously. Alternatively, patterning and etching may be performed individually for the first through hole 65a and the second through hole 66a. The distance between the first through hole 65a and the second through hole 66a may be in a range from 1 to 10 µm. If the distance between the first through hole 65a and the second through hole 66a is small, it is difficult to form the groove. In contrast, if the distance is large, the chip area may increase. Hence, an optimal distance is desirable.

Figure 4D:
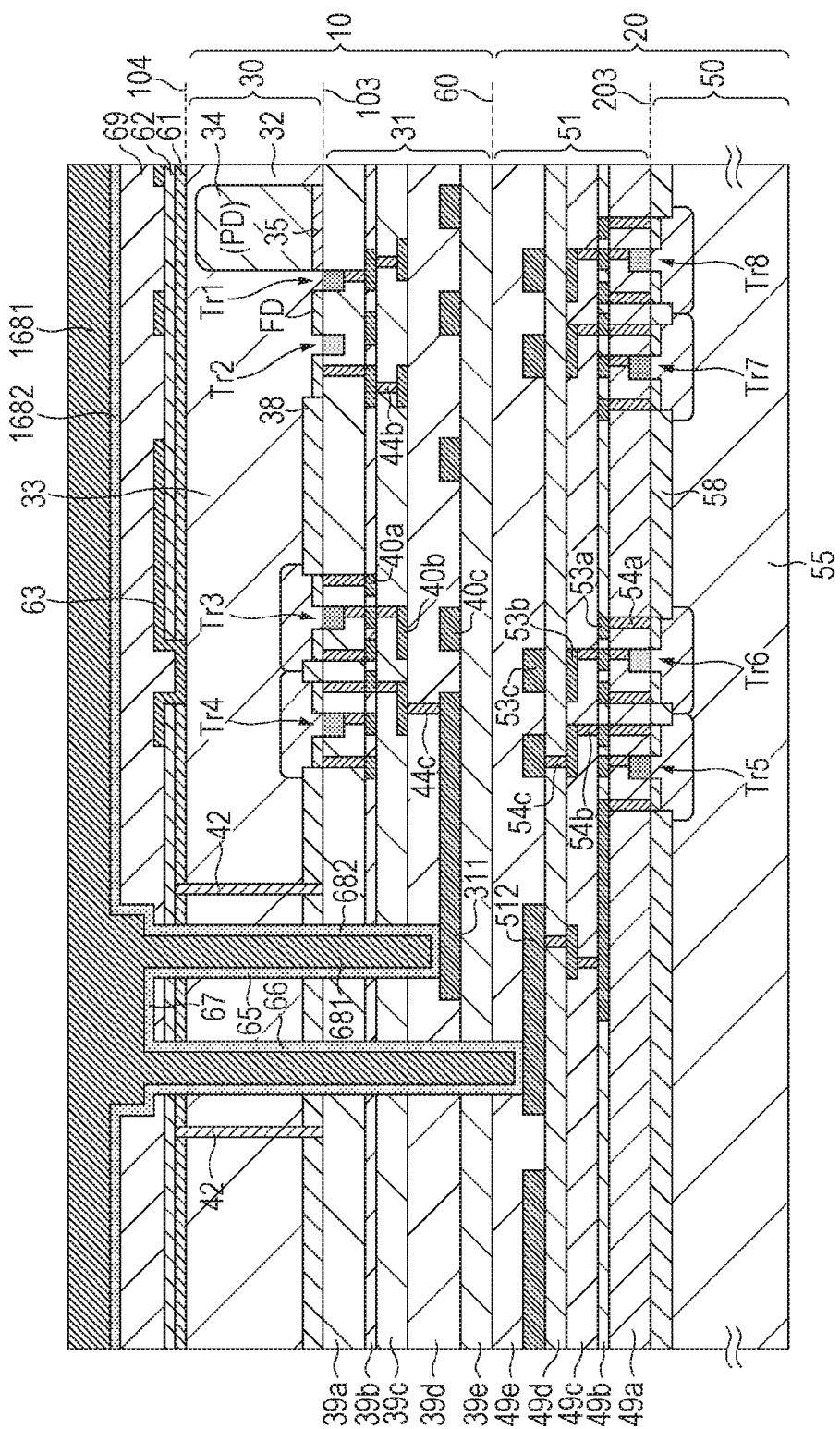

The description is continued with reference to FIG. 4D. The diffusion barrier region 682 is deposited on the first through hole 65a, the second through hole 66a, and the coupling groove 67a. The diffusion barrier region 682 is formed of a single-layer tantalum film. The diffusion barrier region 682 may be formed by depositing the tantalum film with a thickness of, for example, 30 nm. The dimensions of the first through hole 65a and the second through hole 66a are larger than the holes for the plugs of the first wiring 311 and the second wiring 512. Hence, the diffusion barrier region 682 formed in the first through hole 65a and the second through hole 66a may be deposited by a thickness larger than the thickness of the tantalum film formed in the via plugs 44b and 54b.

Then, a conductive material is embedded in the first through hole 65a, the second through hole 66a, and the coupling groove 67a. The first through part 65, the second through part 66, and the coupling part 67 are formed. For example, a copper seed layer with a thickness of 300 nm is deposited in the first through hole 65a, the second through hole 66a, and the coupling groove 67a with the diffusion barrier region 682 deposited, and hence a copper-plated layer with a thickness of 3 µm is formed.

Figure 5E:
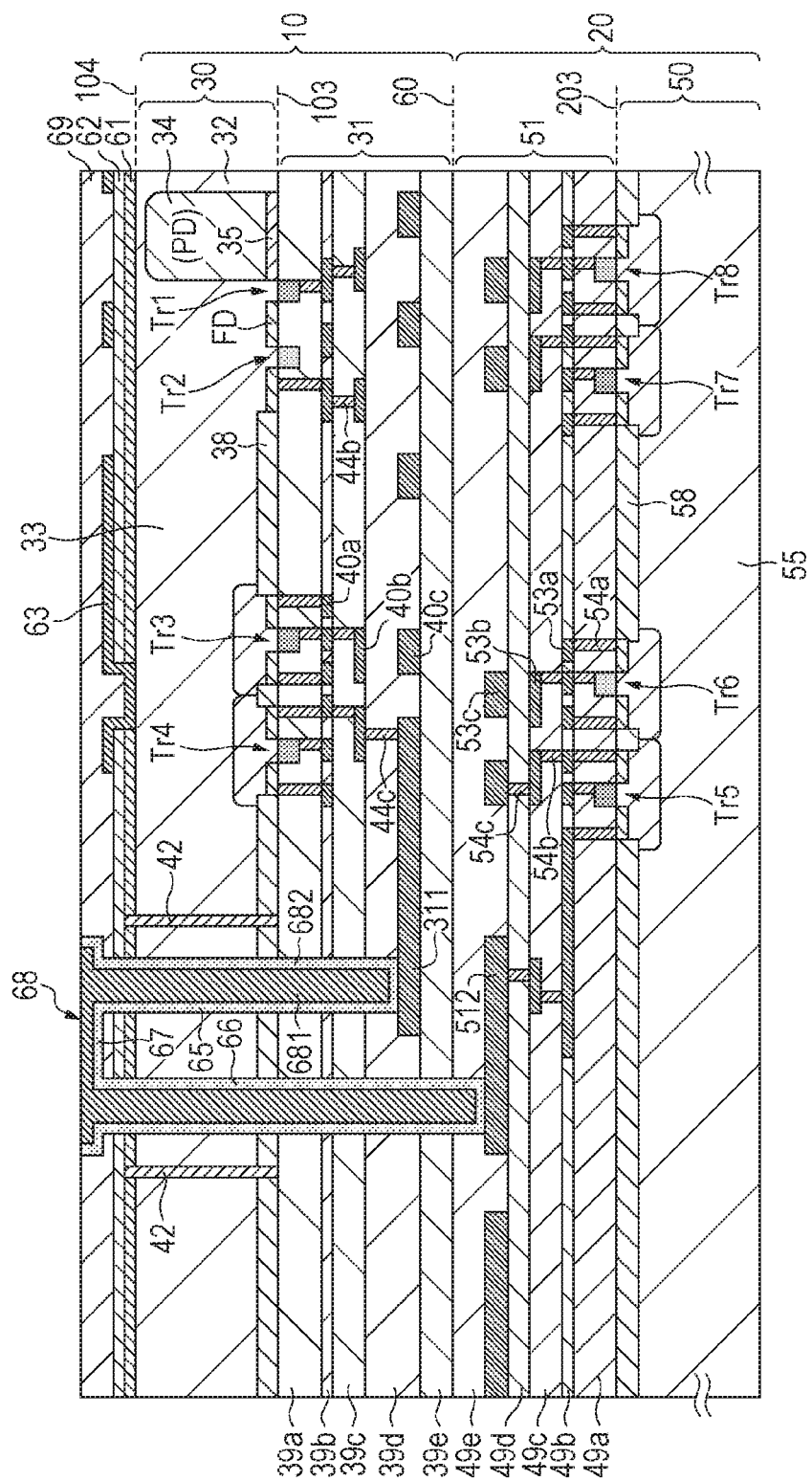
FIGS. 5E and 5F are schematic illustrations showing the example of the manufacturing method of the semiconductor apparatus.
Figure 5F:
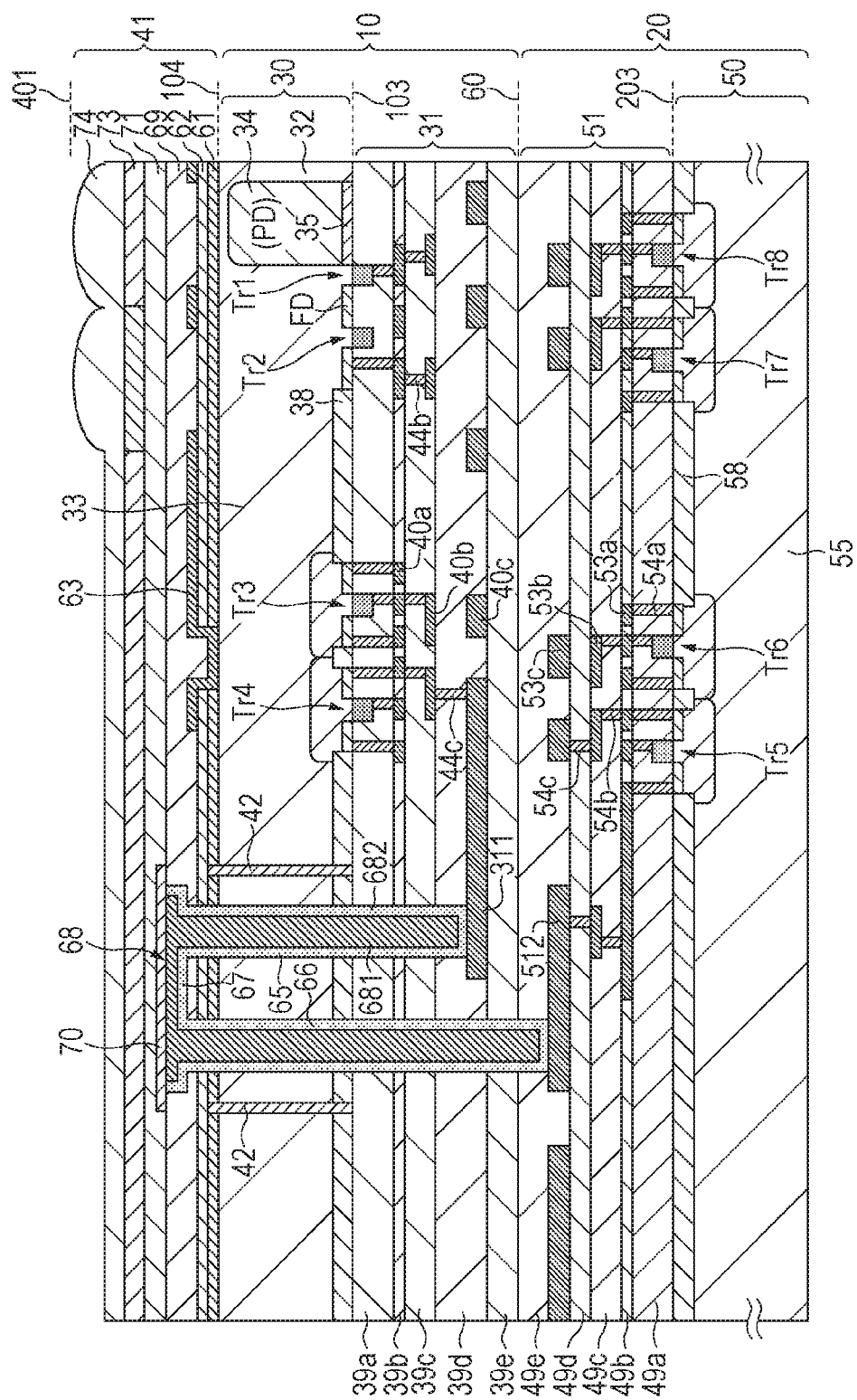

The description is continued with reference to FIG. 5E. By removing excessive portions of the diffusion barrier region 682 and the copper film, the first through part 65, the second through part 66, and the coupling part 67 are formed. Also, the first through part 65, the second through part 66, and the coupling part 67 form the conductive member 68. Accordingly, the wiring pattern 40c of the first wiring part 31 of the first section 10 is electrically connected with the wiring pattern 53c of the second wiring part 51 of the second section 20. Also, in this embodiment, the conductive member 68 is formed within the insulating region 42 formed in the first element part 30, and hence the conductive member 68 is prevented from being electrically connected with the first element part 30.

In the formation step of the conductive member 68 of this embodiment, the dual damascene method of simultaneously embedding copper in the first through hole 65a, the second through hole 66a, and the coupling groove 67a is used. However, it is not limited thereto. For example, a single damascene method may be used. For example, the first through hole 65a and the second through hole 66a may be formed first, the conductive material may be simultaneously embedded in the first through hole 65a and the second through hole 66a, then the coupling groove 67a may be formed, and the conductive material may be embedded in the coupling groove 67a. Also, for the dual damascene method, the example of trench first is described, in which the coupling groove 67a is formed and then the first through hole 65a and the second through hole 66a are formed. However, via first may be employed, in which the first through hole 65a and the second through hole 66a are formed first, and then the coupling groove 67a is formed. Also, the formation of the coupling part 67 is not limited to the embedment of the conductive material, and may be formed by patterning a conductive film of, for example, aluminum. For example, a via plug mainly made of tungsten is formed in an insulating layer formed on the first through part 65 and the second through part 66, and an aluminum film covering the insulating layer and the via plug is patterned by etching. Accordingly, the coupling part 67 formed of the via plug and the aluminum layer may be formed. At this time, barrier metal formed of a titanium layer and/or a titanium nitride layer may be provided between the tungsten serving as the via plug and the insulating layer. Also, barrier metal formed of a titanium layer and/or a titanium nitride layer may be provided at an upper layer and/or a lower layer of the aluminum layer.

Various modifications may be made as long as the conductive member 68, in which the wiring pattern 40c of the first wiring part 31 of the first section 10 is electrically connected with the wiring pattern 53c of the second wiring part 51 of the second section 20, is formed.

The description is continued with reference to FIG. 5F. The cap layer 70 and the planarization layer 71 of insulators are formed to cover the conductive member 68. Like this embodiment, if the coupling part 67 is formed of copper, a silicon nitride film may be used for the cap layer 70. Also, in this embodiment, the cap layer 70 is formed in a region covering the conductive member 68. However, the cap layer 70 may be provided also in a region covering the photoelectric conversion element. Like this embodiment, in case of the photoelectric conversion apparatus, the cap layer in at least the arrangement region of the photodiode may be removed. Also, the planarization layer 71 may be formed of a plurality of films, such as inorganic insulator films or organic insulator films. Also, the planarization layer 71 may be appropriately planarized. The main material of the conductive member 68 formed of the first through part 65, the second through part 66, and the coupling part 67 in this example is copper, and the copper is surrounded by the diffusion barrier region 682 and the cap layer 70. The diffusion barrier region 682 and the cap layer 70 can prevent metal diffusion from occurring at the first through part 65, the second through part 66, the coupling part 67, and the conductive member 68. Next, the color filter 73 and the on-chip lens 74 formed of resin are formed on the planarization layer 71 in that order.

Then, the opening 77 is formed in the electrode pad 78. Accordingly, the configuration in FIG. 2 is obtained. In this embodiment, the formation step of the opening 77 is after the color filter 73 and the on-chip lens 74 are formed. However, the opening 77 may be formed before the color filter 73 and the on-chip lens 74 are formed. After the color filter 73 and the on-chip lens 74 are formed, heat treatment at high temperatures (about 400° C.) cannot be performed, for protection of the color filter 73 and the on-chip lens 74 made of resin. If the semiconductor device 1 is damaged by the processing for the opening 77, heat treatment may be occasionally required for recovery of the damage. The order of processes may be properly changed.

Then, the semiconductor device 1 is bonded to the package by die bonding. Then, the bonding wire 79 for connection with the electrode pad 78 is formed in the opening 77. The package is sealed with a transparent plate. A land grid array (LGA), which is an external terminal of the package, is fixed to a circuit board by reflow soldering.

Second Embodiment

This embodiment provides a case in which the diffusion barrier region 682 is formed of a conductive layer and an insulating layer. A manufacturing method in such a case is described.

Figure 6A:
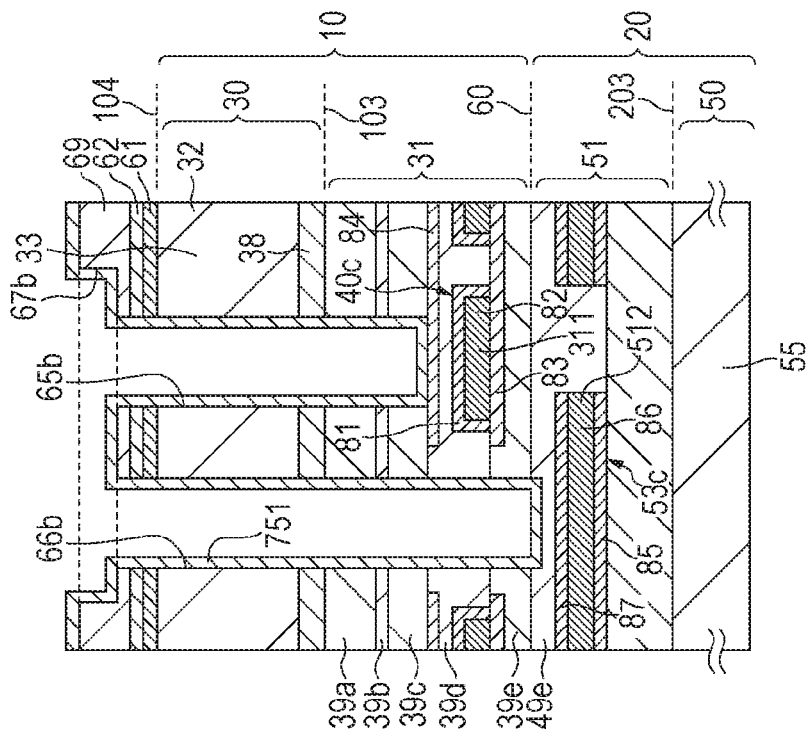
FIGS. 6A to 6F are schematic illustrations showing another example of a manufacturing method of a semiconductor apparatus.

As shown in FIG. 6A, a coupling groove 67b, a first connection hole 65b, and a second connection hole 66b are formed. At this time, portions of diffusion prevention layers 83 and 84 previously provided in the first wiring part 31, the portions which are provided with the second connection hole 66b, are previously removed by patterning. The first connection hole 65b and the second connection hole 66b may be formed simultaneously. At this time, etching is performed by an etching method that causes the etching rate for the insulator layers 39a, 39b, 39c, 39d, 39e, and 49e, which are silicon oxide layers, to be higher than the etching rate for the diffusion prevention layers 83 and 84. Hence, the diffusion prevention layer 84 serves as an etching stopper. Even if the first connection hole 65b and the second connection hole 66b are simultaneously formed, a phenomenon in which the first connection hole 65b reaches wiring first, can be avoided.

Figure 6B:
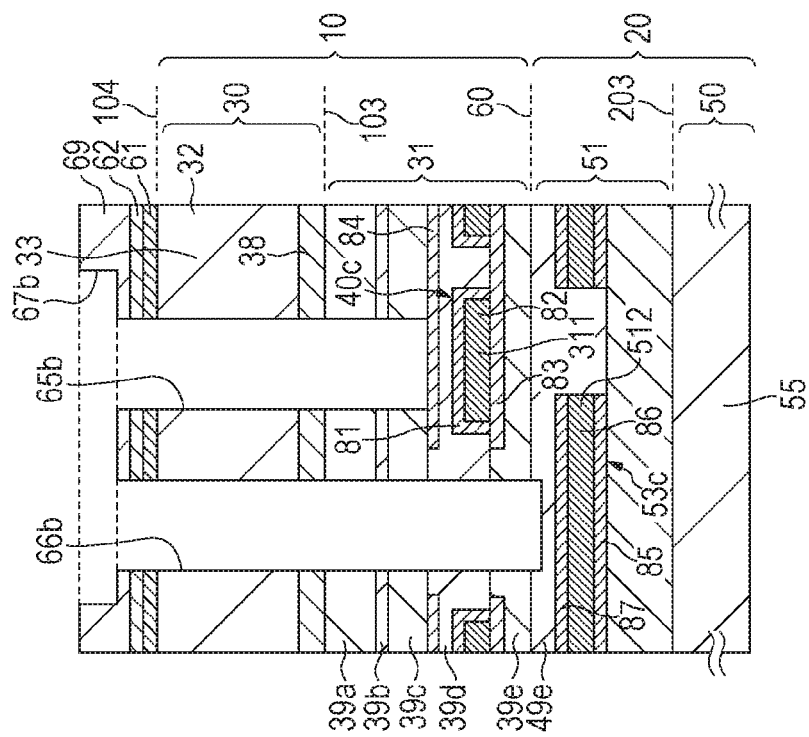

As shown in FIG. 6B, a first diffusion barrier film 751 made of a diffusion barrier material, which is an insulating material such as silicon nitride, is formed.

Figure 6C:
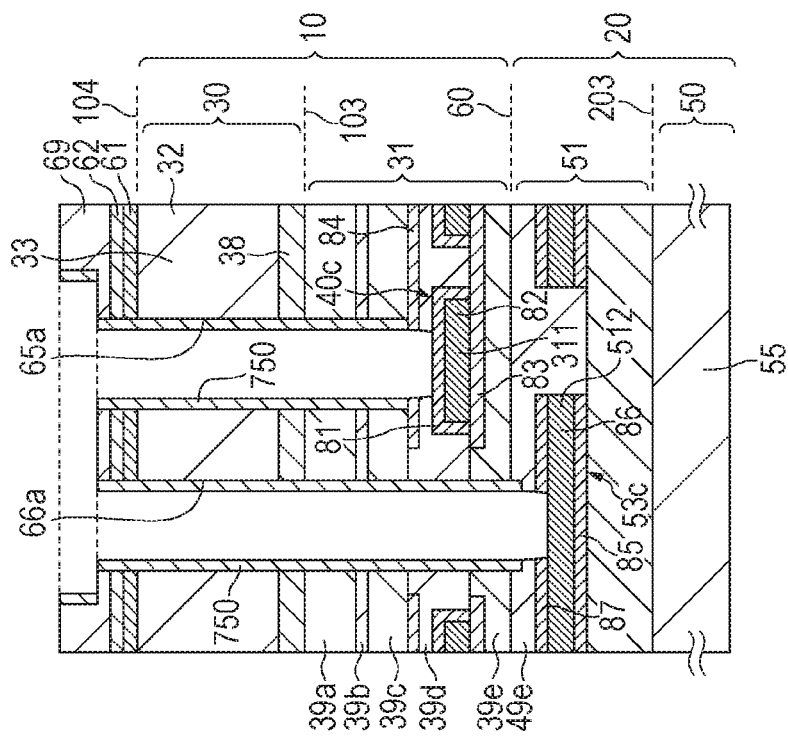

As shown in FIG. 6C, etch back is performed on the diffusion barrier film 751, and a silicon nitride layer 750 having an opening at its bottom portion is formed. The silicon nitride layer 750 becomes an insulating layer 683 of the diffusion barrier region 682, the insulating layer 683 which also functions as an insulating region between the conductive member 68 and the first semiconductor layer 33.

Figure 6D:
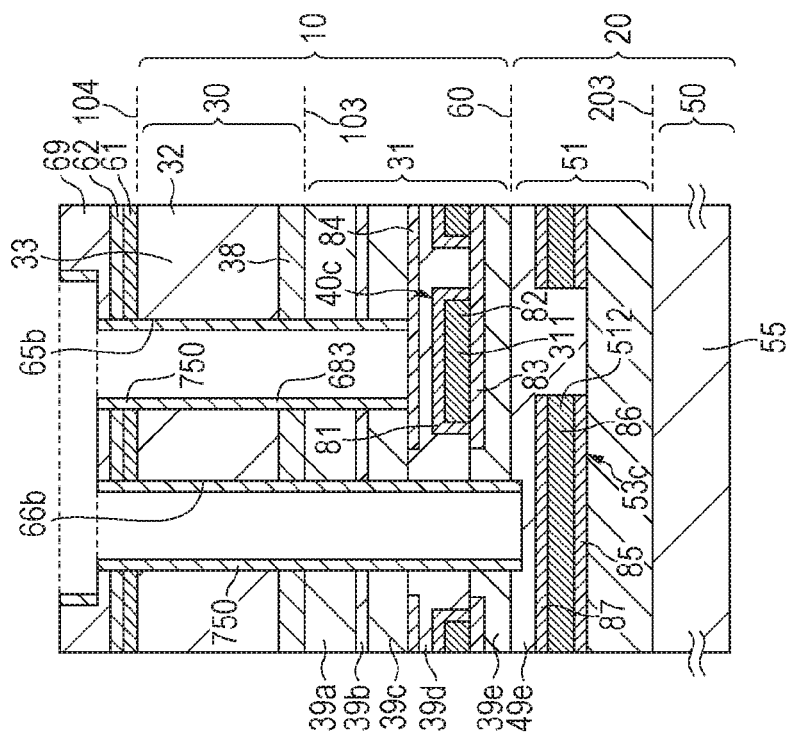

As shown in FIG. 6D, by etching the diffusion prevention layer 84 and the insulator layer 39d, the first through hole 65a that reaches a tantalum layer 81 of barrier metal is formed. Also, by etching the insulator layer 49e and a titanium nitride layer 87 of barrier metal, the second through hole 66a that reaches an aluminum layer 86 is formed.

Figure 6E:
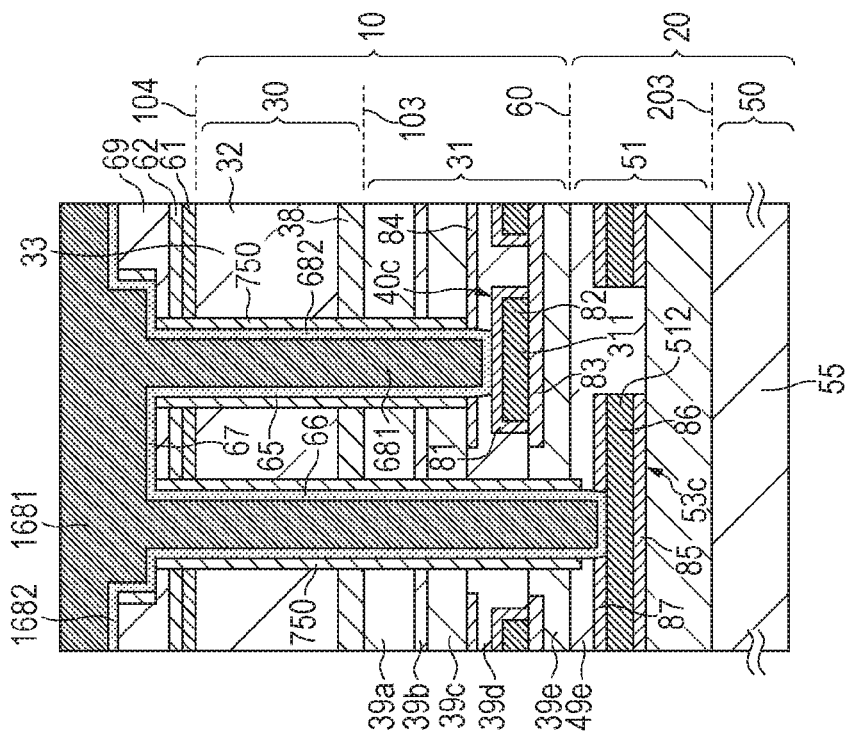

As shown in FIG. 6E, a second diffusion barrier film 1682 made of a diffusion barrier material, which is a conductive material such as tantalum, is formed. The second diffusion barrier film 1682 becomes a conductive layer of the diffusion barrier region 682, the conductive layer which is a portion of the diffusion barrier region 682 and a portion of the conductive member 68. The tantalum layer 81 is located between the second diffusion barrier film 1682 and a copper layer 82. Accordingly, metal contamination due to the etching of the copper layer 82 can be avoided.

Figure 6F:
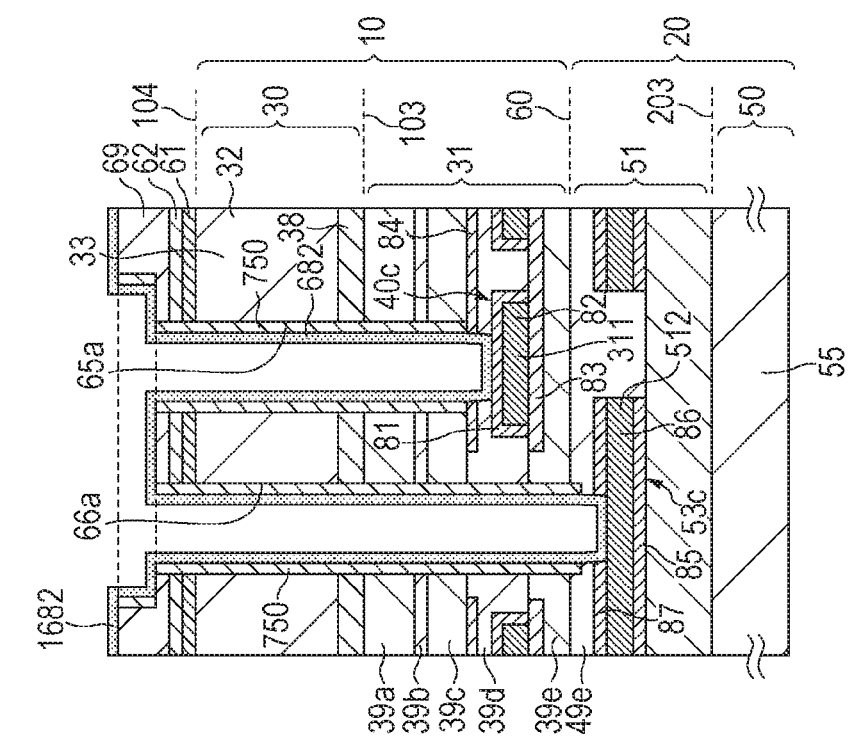

As shown in FIG. 6F, a copper film 1681 is embedded in the first through hole 65a, the second through hole 66a, and the coupling groove. The second diffusion barrier film 1682, which is a tantalum film, is located between the copper film 1681 and the aluminum layer 86. Accordingly, even if the aluminum layer 86 is exposed, the diffusion of the copper in the second through hole 66a to the aluminum layer 86 can be avoided. Then, excessive portions of the second diffusion barrier film 1682 and the copper film 1681 outside the coupling groove are removed by CMP, and hence the conductive member 68 is obtained.

Third Embodiment

Figure 7:
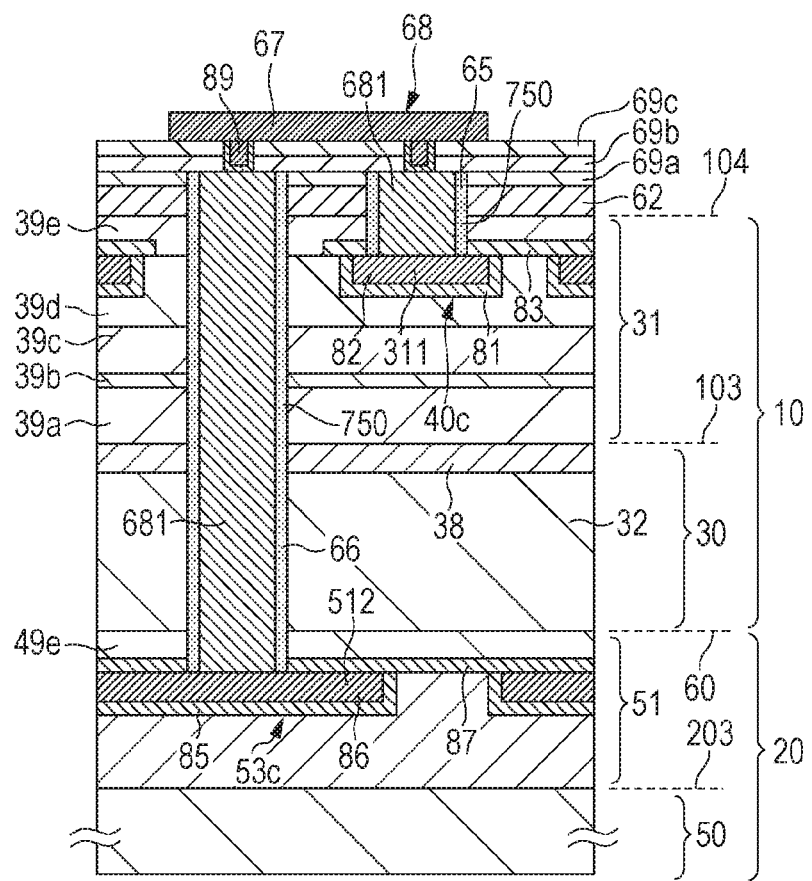
FIG. 7 is a schematic illustration showing still another example of a manufacturing method of a semiconductor apparatus.

This embodiment is a case in which the first element part 30 is located between the first wiring part 31 and the second wiring part 51 as shown in FIG. 7. The second through part 66 penetrates through the first semiconductor layer 33 and the insulator layer 39e. The first through part 65 penetrates through the insulator layer 39e, but does not penetrate through the first semiconductor layer 33.

The diffusion barrier region 750 of this embodiment is made of an insulating material such as silicon nitride. The high-diffusion metal region 681 contains copper. The first wiring 311 of the wiring pattern 40c includes a copper layer 82 and a barrier metal layer 81. The second wiring 512 of the wiring pattern 53c includes a copper layer 86 and a barrier metal layer 85. The first through part 65 and the second through part 66 penetrate through the diffusion prevention layers 83 and 87, and contact the copper layer 82 and the copper layer 86. The coupling part 67 contains an aluminum layer and barrier metal, and connects the first through part 65 with the second through part 66 through a via plug 89 made of tungsten. The via plug 89 penetrate through insulator layers 69b and 69c on an insulator layer 69a.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A semiconductor apparatus, comprising:
   a first semiconductor layer provided with a first transistor and a photoelectric conversion element;
   a second semiconductor layer provided with a second transistor;
   a first conductor layer arranged between the first semiconductor layer and the second semiconductor layer;
   a second conductor layer arranged between the first semiconductor layer and the second semiconductor layer, a distance between the second semiconductor layer and the second conductor layer being smaller than a distance between the second semiconductor layer and the first conductor layer;
   a first insulator layer arranged between the first semiconductor layer and the first conductor layer in a direction where the first semiconductor layer and the second semiconductor layer are stacked each other;
   a second insulator layer arranged between the second conductor layer and the second semiconductor layer;
   a third insulator layer arranged between the first conductor layer and the second conductor layer; and
   a conductive member which has a part arranged in a hole which penetrates through the first semiconductor layer, the first insulator layer, and the third insulator layer, and electrically connects the first conductor layer and the second conductor layer to each other,
   wherein the part of the conductive member comprises a region mainly containing a first conductive material, and a conductive layer mainly containing a second conductive material other than the first conductive material,
   wherein the first conductor layer is included in a first wiring pattern, the first wiring pattern including a first barrier metal layer which is arranged between the first conductor layer and the first insulator layer,
   wherein the second conductor layer is included in a second wiring pattern, the second wiring pattern including a second barrier metal layer,
   wherein the conductive layer is arranged between the region and the first insulator layer, and is in direct contact with the first insulator layer,
   wherein the conductive layer is in direct contact with the first conductor layer and the second conductor layer, and
   wherein the conductive layer is continuously extending from the first conductor layer to the second conductor layer.

2. The semiconductor apparatus according to claim 1, wherein the conductive layer is arranged between the first semiconductor layer and the region.

3. The semiconductor apparatus according to claim 1, further comprising:
   an interlayer insulating layer which is arranged between the first insulator layer and the first semiconductor layer in the direction; and
   a wiring pattern which is arranged between the first insulator layer and the interlayer insulating layer,
   wherein the conductive layer is in direct contact with the interlayer insulating layer.

4. The semiconductor apparatus according to claim 2, wherein the conductive layer is arranged between the region and the third insulator layer and is in direct contact with the third insulator layer.

5. The semiconductor apparatus according to claim 4, wherein the second conductor layer contains copper.

6. The semiconductor apparatus according to claim 5, wherein the second conductive material is at least one of metal nitride and metal carbide, and wherein the conductive layer is in direct contact with the third insulator layer.

7. The semiconductor apparatus according to claim 1, wherein the second conductive material is at least one of tantalum, tantalum nitride, tantalum carbide, titanium, titanium nitride, titanium carbide, tungsten, tungsten nitride, tungsten carbide and manganese.

8. The semiconductor apparatus according to claim 7, wherein the first conductive material is at least one of gold, silver, copper, nickel, iron, and zinc, and wherein the conductive layer is in direct contact with the first insulator layer.

9. The semiconductor apparatus according to claim 8, wherein at least one of the first insulator layer, the second insulator layer and the third insulator layer has a dielectric constant lower than that of silicon oxide.

10. The semiconductor apparatus according to claim 1, wherein the conductive member has a first part in direct contact with the second conductor layer, and a second part which couples the first part and a part which is in direct contact with the first conductor layer together.

11. The semiconductor apparatus according to claim 1, wherein the first semiconductor layer has an opening for a wire bonding connection or a flip-chip connection.

12. The semiconductor apparatus according to claim 3, wherein the wiring pattern includes a copper layer.

13. The semiconductor apparatus according to claim 1, wherein a thickness of the conductive layer is larger than a thickness of the first barrier metal layer of the first wiring pattern.

14. An electronic equipment comprising:
the semiconductor apparatus according to claim 1; and
a peripheral device connected to the semiconductor apparatus,
wherein the peripheral device is an arithmetic operation device, a memory device, a communication device or a display device.

15. The semiconductor apparatus according to claim 4, wherein the conductive layer surrounds the region in the hole.

16. The semiconductor apparatus according to claim 15, wherein the conductive layer restricts a diffusion of the first conductive material to the first semiconductor layer, the first insulator layer, and the third insulator layer.

17. The semiconductor apparatus according to claim 1, wherein the first conductive material is embedded in the hole via the conductive layer.

18. The semiconductor apparatus according to claim 1, further comprising:
an electrode pad connected to a wire bonding,
wherein an insulating material is arranged between the second conductor layer and the electrode pad.

19. A semiconductor apparatus, comprising:
a first semiconductor layer provided with a first transistor and a photoelectric conversion element;
a second semiconductor layer provided with a second transistor;
a first conductor layer arranged between the first semiconductor layer and the second semiconductor layer;
a second conductor layer arranged between the first semiconductor layer and the second semiconductor layer, a distance between the second semiconductor layer and the second conductor layer being smaller than a distance between the second semiconductor layer and the first conductor layer in a direction where the first semiconductor layer and the second semiconductor layer are stacked each other; and
a conductive member which electrically connects the first conductor layer with the second conductor layer to each other,
wherein the conductive member comprises a conductive layer mainly containing at least one of tantalum, tantalum nitride, tantalum carbide, titanium, titanium nitride, titanium carbide, tungsten, tungsten nitride, tungsten carbide and manganese,
wherein the first conductor layer is included in a first wiring pattern, the first wiring pattern including a first barrier metal layer which is arranged between the first conductor layer and the first insulator layer,
wherein the second conductor layer is included in a second wiring pattern, the second wiring pattern including a second barrier metal layer,
wherein the conductive layer is in direct contact with the first conductor layer and the second conductor layer, and is in direct contact with the first semiconductor layer, and
wherein the conductive layer is continuously extending from the first conductor layer to the second conductor layer.

20. The semiconductor apparatus according to claim 19, wherein the first semiconductor layer has a trench arranged between a first portion of the first semiconductor layer and a second portion of the first semiconductor layer and isolating the first portion of the first semiconductor layer from the second portion of the first semiconductor layer,
wherein the second portion of the first semiconductor layer is arranged between the trench and the conductive member, and is in direct contact with the conductive layer.

21. The semiconductor apparatus according to claim 20, further comprising an element isolator which is arranged on the first semiconductor layer by shallow trench isolation or local oxidation of silicon, wherein an insulating material in the trench is in direct contact with the element isolator.

22. The semiconductor apparatus according to claim 19, further comprising:
a first insulator layer which is arranged between the first semiconductor layer and the first conductor layer;
a second insulator layer which is arranged between the second conductor layer and the second semiconductor layer; and
a third insulator layer which is arranged between the first conductor layer and the second conductor layer,
wherein the conductive layer is in direct contact with at least one of the first insulator layer and the third insulator layer.

23. The semiconductor apparatus according to claim 22, wherein the conductive layer mainly contains titanium nitride and is in direct contact with at least one of the first insulator layer and the third insulator layer.

24. An electronic equipment comprising:
the semiconductor apparatus according to claim 19; and
a peripheral device connected to the semiconductor apparatus,
wherein the peripheral device is an arithmetic operation device, a memory device, a communication device or a display device.

25. The semiconductor apparatus according to claim 22, further comprising:

an interlayer insulating layer which is arranged between the first insulator layer and the first semiconductor layer in the direction; and
a wiring pattern which is arranged between the first insulator layer and the interlayer insulating layer,
wherein the conductive layer is in direct contact with the interlayer insulating layer.

26. The semiconductor apparatus according to claim 22, wherein the second conductor layer contains copper.

27. The semiconductor apparatus according to claim 22, wherein the conductive member has a part arranged in a hole which penetrates through the first semiconductor layer and the first insulator layer, and
wherein the conductive layer is in direct contact with an inner surface of the first semiconductor layer and an inner surface of the first insulator layer, in the hole.

28. The semiconductor apparatus according to claim 19, comprising blocks, each of the blocks comprising:
the conductive member; and
a first trench and a second trench arranged in the first semiconductor layer;
wherein the conductive member is arranged between the first trench and the second trench in the first semiconductor layer, and
wherein the blocks are aligned.

29. The semiconductor apparatus according to claim 27, wherein the first conductive material is embedded in the hole via the conductive layer.

30. The semiconductor apparatus according to claim 19, further comprising:
an electrode pad connected to a wire bonding,
wherein an insulating material is arranged between the second conductor layer and the electrode pad.

31. A semiconductor apparatus, comprising:
a first semiconductor layer provided with a first transistor and a photoelectric conversion element;
a second semiconductor layer provided with a second transistor;
a first conductor layer arranged between the first semiconductor layer and the second semiconductor layer;
a second conductor layer arranged between the first semiconductor layer and the second semiconductor layer, a distance between the second semiconductor layer and the second conductor layer being smaller than a distance between the second semiconductor layer and the first conductor layer in a direction where the first semiconductor layer and the second semiconductor layer are stacked each other; and
a conductive member which electrically connects the first conductor layer with the second conductor layer to each other,
wherein the conductive member comprises a conductive layer mainly containing at least one of tantalum, tantalum nitride, tantalum carbide, titanium, titanium nitride, titanium carbide, tungsten, tungsten nitride, tungsten carbide and manganese,
wherein the first conductor layer is included in a first wiring pattern, the first wiring pattern including a first barrier metal layer which is arranged between the first conductor layer and the first insulator layer,
wherein the second conductor layer is included in a second wiring pattern, the second wiring pattern including a second barrier metal layer,
wherein the conductive layer is in direct contact with the first conductor layer and the second conductor layer, and is in direct contact with the first insulator layer, and
wherein the conductive layer is continuously extending from the first conductor layer to the second conductor layer.

32. The semiconductor apparatus according to claim 31, wherein the first semiconductor layer has a trench arranged between a first portion of the first semiconductor layer and a second portion of the first semiconductor layer and isolating the first portion of the first semiconductor layer from the second portion of the first semiconductor layer,
wherein the second portion of the first semiconductor layer is arranged between the trench and the conductive member, and is in direct contact with the conductive layer.

33. The semiconductor apparatus according to claim 31, further comprising an element isolator which is arranged on the first semiconductor layer by shallow trench isolation or local oxidation of silicon, wherein an insulating material in the trench is in direct contact with the element isolator.

34. The semiconductor apparatus according to claim 31, further comprising:
a first insulator layer which is arranged between the first semiconductor layer and the first conductor layer;
a second insulator layer which is arranged between the second conductor layer and the second semiconductor layer; and
a third insulator layer which is arranged between the first conductor layer and the second conductor layer,
wherein the conductive layer is in direct contact with the third insulator layer.

35. The semiconductor apparatus according to claim 34, wherein the conductive layer mainly contains titanium nitride and is in direct contact with at least one of the first insulator layer and the third insulator layer.

36. An electronic equipment comprising:
the semiconductor apparatus according to claim 31; and
a peripheral device connected to the semiconductor apparatus,
wherein the peripheral device is an arithmetic operation device, a memory device, a communication device or a display device.

37. The semiconductor apparatus according to claim 34, further comprising:
an interlayer insulating layer which is arranged between the first insulator layer and the first semiconductor layer in the direction; and
a wiring pattern which is arranged between the first insulator layer and the interlayer insulating layer,
wherein the conductive layer is in direct contact with the interlayer insulating layer.

38. The semiconductor apparatus according to claim 34, wherein the second conductor layer contains copper.

39. The semiconductor apparatus according to claim 34, wherein the conductive member has a part arranged in a hole which penetrates through the first semiconductor layer and the first insulator layer, and
wherein the conductive layer is in direct contact with an inner surface of the first insulator layer in the hole.

40. The semiconductor apparatus according to claim 31, comprising blocks, each of the blocks comprising:
the conductive member; and
a first trench and a second trench arranged in the first semiconductor layer;
wherein the conductive member is arranged between the first trench and the second trench in the first semiconductor layer, and
wherein the blocks are aligned.

41. The semiconductor apparatus according to claim 39, wherein the first conductive material is embedded in the hole via the conductive layer.

42. The semiconductor apparatus according to claim 31, further comprising:
   an electrode pad connected to a wire bonding,
   wherein an insulating material is arranged between the second conductor layer and the electrode pad.

* * * * *